(12) United States Patent
Li et al.

(10) Patent No.: US 10,734,285 B2
(45) Date of Patent: Aug. 4, 2020

(54) BONDING SUPPORT STRUCTURE (AND RELATED PROCESS) FOR WAFER STACKING

(71) Applicant: Taiwan Semiconductor Manufacturing Co., Ltd., Hsin-Chu (TW)

(72) Inventors: Sheng-Chan Li, Tainan (TW); Cheng-Hsien Chou, Tainan (TW); Cheng-Yuan Tsai, Chu-Pei (TW); Chih-Hui Huang, Yongkang (TW); Kuo-Ming Wu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/178,819

(22) Filed: Nov. 2, 2018

(65) Prior Publication Data

US 2020/0006145 A1 Jan. 2, 2020

Related U.S. Application Data

(60) Provisional application No. 62/691,291, filed on Jun. 28, 2018.

(51) Int. Cl.
| | | |
|---|---|---|
| *H01L 21/822* | (2006.01) | |
| *H01L 23/532* | (2006.01) | |
| *H01L 23/528* | (2006.01) | |
| *H01L 23/522* | (2006.01) | |
| *H01L 21/768* | (2006.01) | |

(Continued)

(52) U.S. Cl.
CPC .... *H01L 21/8221* (2013.01); *H01L 21/76832* (2013.01); *H01L 23/5226* (2013.01); *H01L 23/5283* (2013.01); *H01L 23/53295* (2013.01); *H01L 24/03* (2013.01); *H01L 24/09* (2013.01); *H01L 24/89* (2013.01);
(Continued)

(58) Field of Classification Search
CPC . H01L 2924/00014; H01L 2224/05647; H01L 2224/80896; H01L 2224/94; H01L 25/0657; H01L 21/76898; H01L 2224/08147
USPC .......................................... 257/686; 438/109
See application file for complete search history.

(56) References Cited

U.S. PATENT DOCUMENTS

| 9,768,089 B2 * | 9/2017 | Rajoo ..................... H01L 24/29 |
| 2009/0134500 A1 * | 5/2009 | Kuo ..................... H01L 23/481 |
| | | 257/659 |

(Continued)

FOREIGN PATENT DOCUMENTS

KR        20000066199 A      11/2000

*Primary Examiner* — Jonathan Han
(74) *Attorney, Agent, or Firm* — Eschweiler & Potashnik, LLC

(57) ABSTRACT

In some embodiments, a method for bonding semiconductor wafers is provided. The method includes forming a first integrated circuit (IC) over a central region of a first semiconductor wafer. A first ring-shaped bonding support structure is formed over a ring-shaped peripheral region of the first semiconductor wafer, where the ring-shaped peripheral region of the first semiconductor wafer encircles the central region of the first semiconductor wafer. A second semiconductor wafer is bonded to the first semiconductor wafer, such that a second IC arranged on the second semiconductor wafer is electrically coupled to the first IC.

20 Claims, 23 Drawing Sheets

(51) Int. Cl.
    *H01L 23/00*    (2006.01)
    *H01L 25/065*   (2006.01)
(52) U.S. Cl.
    CPC .. *H01L 25/0655* (2013.01); *H01L 2224/0231*
            (2013.01); *H01L 2224/02373* (2013.01)

(56) References Cited

U.S. PATENT DOCUMENTS

| | | | | |
|---|---|---|---|---|
| 2009/0311829 | A1* | 12/2009 | Yang | H01L 21/561 |
| | | | | 438/109 |
| 2013/0285228 | A1 | 10/2013 | Montez et al. | |
| 2014/0124889 | A1* | 5/2014 | Qian | H01L 27/14618 |
| | | | | 257/448 |
| 2015/0194455 | A1* | 7/2015 | Ho | H01L 27/14634 |
| | | | | 257/460 |
| 2016/0093591 | A1* | 3/2016 | Lan | H01L 21/02164 |
| | | | | 257/506 |

* cited by examiner

BONDING SUPPORT STRUCTURE (AND RELATED PROCESS) FOR WAFER STACKING

REFERENCE TO RELATED APPLICATION

This application claims priority to U.S. Provisional Application No. 62/691,291 filed on Jun. 28, 2018, the contents of which are hereby incorporated by reference in their entirety.

BACKGROUND

The semiconductor industry has continually improved the processing capabilities and power consumption of integrated circuits (ICs) by shrinking the minimum feature size. However, in recent years, process limitations have made it difficult to continue shrinking the minimum feature size. The stacking of two-dimensional (2D) ICs into three-dimensional (3D) ICs has emerged as a potential approach to continue improving processing capabilities and power consumption of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
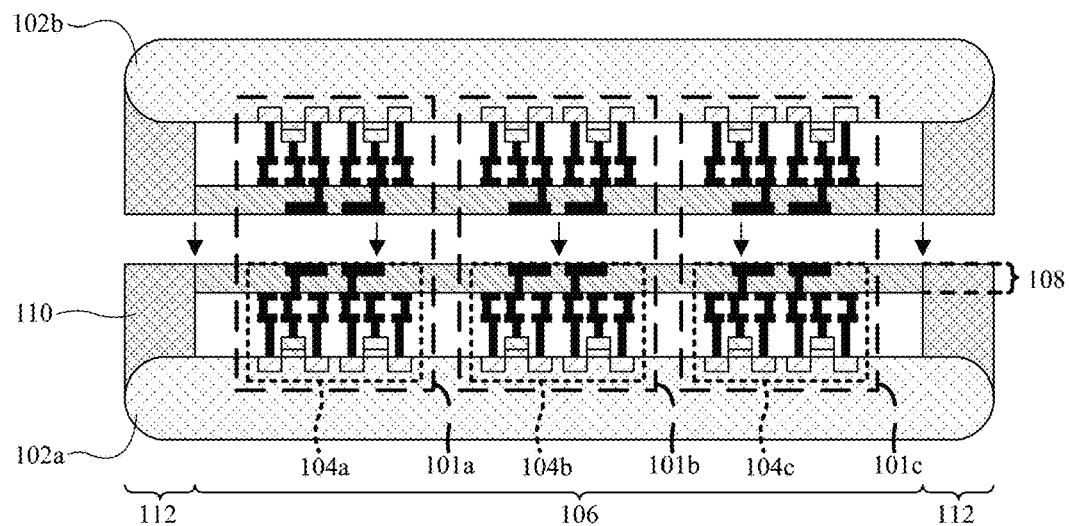
FIG. 1 illustrates a cross-sectional view of a plurality of semiconductors wafers, each having bonding support structures disposed over peripheral regions, being bonded together.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional (3D) integrated circuit (IC) comprises a plurality of integrated chip die that are stacked and bonded together. One possible method to manufacture a 3D IC includes a wafer stacking method that comprises bonding a first semiconductor wafer to a second semiconductor wafer. In such a method, a plurality of first 2D ICs are disposed on the first semiconductor wafer, and a first bonding structure is disposed over the first 2D ICs. A plurality of second 2D ICs are disposed on the second semiconductor wafer, and a second bonding structure is disposed over the plurality of second 2D ICs. The first bonding structure and the second bonding structure may be stacked on one another and bonded together (e.g., via eutectic bonding, hybrid bonding, etc.), such that a plurality of 3D ICs are formed, each of which comprise a first 2D IC electrically coupled to a second 2D IC. Subsequently, a wafer dicing process (e.g., mechanical sawing, laser cutting, etc.) may be performed on the bonded semiconductor wafers to form a plurality of separate 3D ICs.

One challenge with the above wafer stacking method is non-bond (NB) areas. NB areas are areas over the first semiconductor wafer and/or areas over the second semiconductor wafer that will not bond together during a bonding process (e.g., due to an upper surface of the first bonding structure not being substantially planar between opposite edges of the first semiconductor wafer). For example, because semiconductor wafers typically have a rounded/bullet-shaped bevel region, NB areas may exist over a peripheral region of the first semiconductor wafer and/or a peripheral region of the second semiconductor wafer.

During bonding, these NB areas may result in inadequate structural support between the first semiconductor wafer and the second semiconductor wafer, which may be exacerbated as the number of semiconductor wafers being bonded together increases (e.g., 5 semiconductor wafer stacking). This inadequate structural support may introduce unwanted mechanical stress(es) during bonding and/or during subsequent processing steps of the bonded semiconductor wafers (e.g., stacking and/or bonding of additional semiconductor wafers, handling of the bonded semiconductor wafers, dicing of the bonded semiconductor wafers, etc.). This unwanted mechanical stress may lead to mechanical failures (e.g., delamination, cracking, etc.) that reduce the yield of the 3D ICs.

In various embodiments, the present application is directed toward a method of bonding together a first semiconductor wafer and a second semiconductor wafer to reduce NB areas (e.g., a peripheral region) of the first semiconductor wafer. The method includes forming a bonding support structure (e.g., a layer of dielectric material) over the peripheral region of the first semiconductor wafer. Subsequently, the first semiconductor wafer is bonded to the second semiconductor wafer. By forming the bonding support structure over the peripheral region of the first semiconductor wafer, NB areas over the peripheral region of the first semiconductor wafer may be reduced. In some embodiments, the bonding support structure may reduce NB areas over the peripheral region of the first semiconductor wafer due to the bonding support structure having an upper surface that is substantially planar with an upper surface of a bonding structure of the first semiconductor wafer. In other embodiments, the bonding support structure may reduce NB areas over the peripheral region of the first semiconductor wafer by being a substructure over which the bonding structure (or portions of the bonding structure) may be formed, such that the bonding structure may be formed with a substantially planar upper surface that extends between opposite edges of the first semiconductor wafer.

By reducing the NB areas over the peripheral region of the first semiconductor wafer, during bonding, structural support between the first semiconductor wafer and the second semiconductor wafer may be improved. This improved structural support may reduce unwanted mechanical stresses during bonding and/or during subsequent processing steps of the bonded semiconductor wafers. Accordingly, the bonding support structure may improve the yield of 3D ICs.

FIG. 1 illustrates a cross-sectional view of a plurality of semiconductors wafers, each having bonding support structures disposed over peripheral regions, being bonded together.

As shown in FIG. 1, a plurality of semiconductor wafers 102a-b are being bonded together (e.g., via hybrid bonding, eutectic bonding, etc.) to form a plurality of three-dimensional (3D) integrated circuits (ICs) 101a-c. For example, a first semiconductor wafer 102a is being bonded to a second semiconductor wafer 102b to form a first 3D IC 101a, a second 3D IC 101b, and a third 3D IC 101c.

A plurality of two-dimensional (2D) integrated circuits (ICs) 104a-c are disposed on each of the semiconductor wafers 102a-b. For example, a first 2D IC 104a, a second 2D IC 104b, and a third 2D IC 104c are disposed on both the first semiconductor wafer 102a and the second semiconductor wafer 102b. In some embodiments, the pluralities of 2D ICs 104a-c are disposed in/over central regions 106 of the semiconductor wafers 102a-b, respectively. Further, bonding structures 108 are disposed over the semiconductor wafers 102a-b, respectively. In some embodiments, the bonding structures 108 are disposed over the pluralities of 2D ICs 104a-c, respectively. In further embodiments, the bonding structures 108 are disposed over the central regions 106 of the semiconductor wafers 102a-b, respectively.

Bonding support structures 110 are disposed over each of the semiconductor wafers 102a-b. The bonding support structures 110 are disposed over peripheral regions 112 of each of the semiconductor wafers 102a-b. In some embodiments, the bonding support structures 112 respectively comprise a layer of dielectric material (e.g., an oxide, a nitride, or the like) that extends around an outer perimeter of the semiconductor wafers 102a-b as a ring. By forming the bonding support structures 110 over the peripheral regions 112 of the semiconductor wafers 102a-b, the bonding support structures 110 are able to increase a height of the peripheral regions 112 to be substantially equal to a height of the central regions 106 of the semiconductor wafers 102a-b. By increasing a height of the peripheral regions 112, the bonding support structures 110 are configured to reduce non-bond (NB) areas over the peripheral regions 112 of the semiconductor wafers 102a-b. In some embodiments, the bonding support structures 110 may reduce NB areas over the peripheral regions 112 of the semiconductor wafers 102a-b due to the upper surfaces of the bonding support structures 110 being substantially planar with upper surfaces of the bonding structures 108, respectively. In other embodiments, the bonding support structures 110 may reduce NB areas over the peripheral regions 112 of the semiconductor wafers 102a-b by being substructures over which the bonding structures 108 (or portions of the bonding structures 108) may be formed, such that the bonding structures 108 may be formed with substantially planar upper surfaces that extend between opposite edges of the semiconductor wafers 102a-b, respectively.

By reducing NB areas over the peripheral regions 112 of the semiconductor wafers 102a-b, during bonding, structural support between the first semiconductor wafer 102a and the second semiconductor wafer 102b may be improved. The improved structural support may reduce unwanted mechanical stresses during bonding and/or during subsequent processing steps of the bonded together semiconductor wafers 102a-b. Accordingly, the bonding support structures 110 may improve the yield of the 3D ICs 101a-101c.

Figure 2:
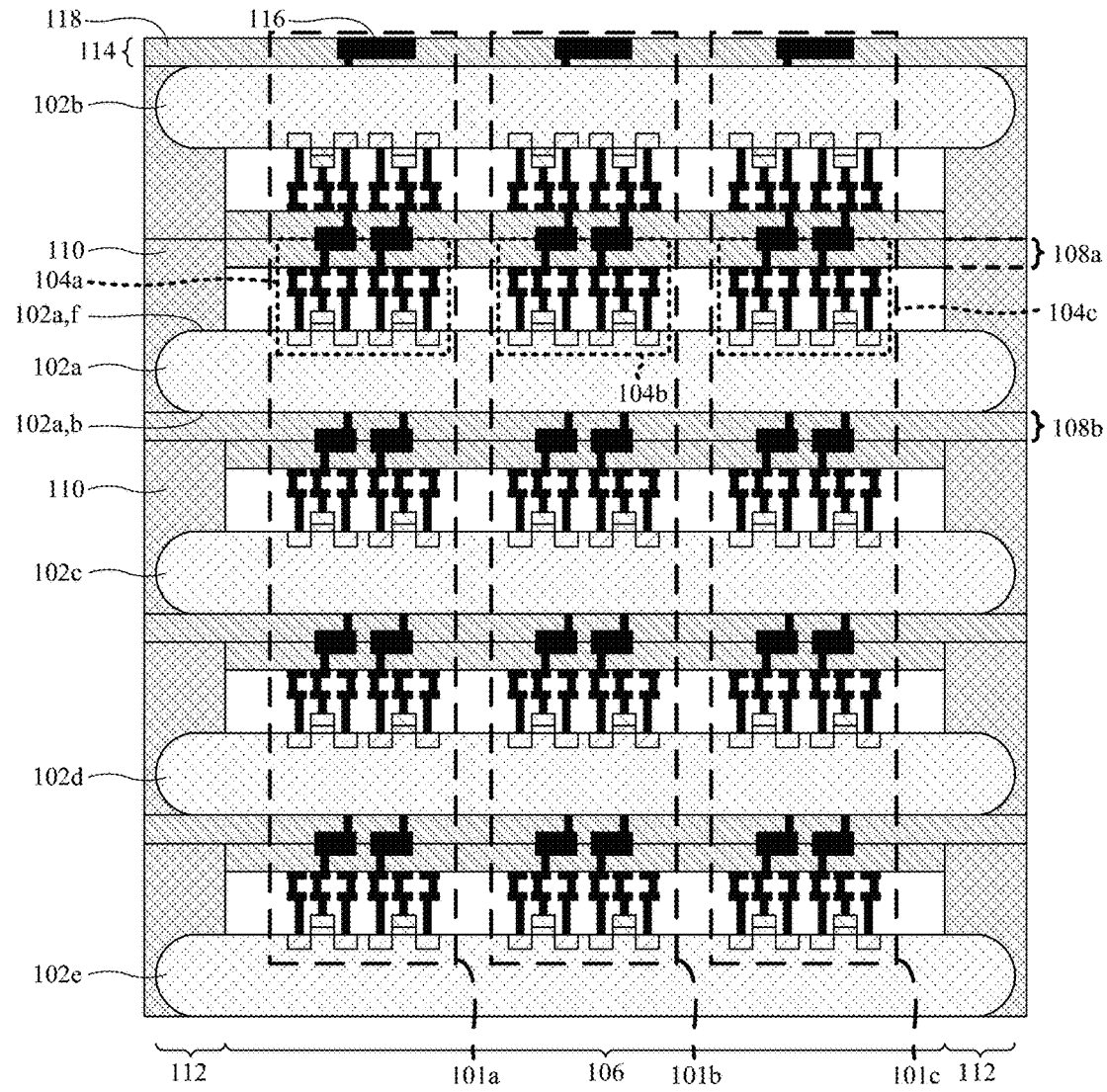
FIG. 2 illustrates a cross-sectional view of a plurality of semiconductor wafers, each having bonding support structures disposed over peripheral regions, bonded together.

FIG. 2 illustrates a cross-sectional view of a plurality of semiconductor wafers, each having bonding support structures disposed over peripheral regions, bonded together.

As shown in FIG. 2, a plurality of semiconductor wafers 102a-e are bonded together. In some embodiments, the plurality of semiconductor wafers 102a-e comprises a first semiconductor wafer 102a, a second semiconductor wafer 102b, a third semiconductor wafer 102c, a fourth semiconductor wafer 102d, and a fifth semiconductor wafer 102e. It will be appreciated that the plurality of semiconductor wafers 102a-e may comprise any number of semiconductor wafers.

In some embodiments, some of the semiconductor wafers 102a-e comprise a first bonding structure 108a and a second bonding structure 108b. For example, the first semiconductor wafer 102a may comprise a first bonding structure 108a disposed on a front-side 102a,f of the first semiconductor wafer 102a and a second bonding structure 108b disposed on a back-side 102a,b of the first semiconductor wafer 102a. In further embodiments, the front-side (e.g., 102a,f) of the semiconductor wafers 102a-e may correspond to the side of the semiconductor wafers 102a-e in which the 2D ICs 104a-c are disposed. In yet further embodiments, the back-side (e.g., 102a,b) of each of the semiconductor wafers 102a-e corresponds to a side of the semiconductor wafer that is opposite the front-side (e.g., 102a,f) of the semiconductor wafer.

In some embodiments, some of the semiconductor wafers 102a-e are coupled to multiple semiconductor wafers. For example, the first semiconductor wafer 102a may be bonded to the third semiconductor wafer 102c and the second semiconductor wafer 102b. In further embodiments, the third semiconductor wafer 102c is bonded to the first semiconductor wafer 102a via the second bonding structure 108b. In further embodiments, the bonding support structures 110 may extend along outer edges of the first semiconductor wafers 102a towards the back-side 102a,b of the first semiconductor wafer 102, such that bonding support structures 110 are substructures on which the second bonding structure 108b may be partially disposed. Thus, NB areas between the first semiconductor wafer 102a and the third semiconductor wafer 102c may be reduced.

In some embodiments, through-substrate vias (TSVs) (not shown) extend through the first semiconductor wafer 102a to electrically couple the plurality of 2D ICs 104a-c of the first semiconductor wafer 102a to the plurality of 2D ICs 104a-c of the third semiconductor wafer 102c. In further embodiments, the second semiconductor wafer 102b is bonded to the first semiconductor wafer 102a via the first bonding structure 108a, such that the plurality of 2D ICs 104a-c of the first semiconductor wafer 102a, the plurality of 2D ICs 104a-c of the second semiconductor wafer 102b, and the plurality of 2D ICs 104a-c of the third semiconductor wafer 102c are electrically coupled together. It will be appreciated that substantially similar electrical coupling may exist between each of the semiconductor wafers 102a-e to form a plurality of 3D ICs 101a-101c.

In some embodiments, an input/output (I/O) structure 114 may be disposed on an uppermost (or bottommost) semiconductor wafer (e.g., the second semiconductor wafer 102b) of the plurality of semiconductor wafers 102a-e. In further embodiments, the I/O structure 114 comprises a plurality of I/O conductive contacts 116 (e.g., contact pads, solder bumps, etc.) disposed in/over an I/O dielectric layer 118. The I/O structure 114 is configured to provide electrical connections to the 3D ICs 101a-c and their respective semiconductor package. For example, one or more I/O conductive contacts 116 may be electrically coupled to the first 3D IC 101a. In further embodiments, TSVs (not shown) extend through the uppermost (or bottommost) semiconductor wafer to electrically couple the I/O conductive contacts 116 to the plurality of 2D ICs 104a-c of the uppermost (or bottommost) semiconductor wafer. In yet further embodiments, the 2D ICs 104a-c of the uppermost (or bottommost) semiconductor wafer may comprise logic configured to access the semiconductor devices of the other 2D ICs 104a-c of the 3D ICs 101a-c, respectively.

Figure 3:
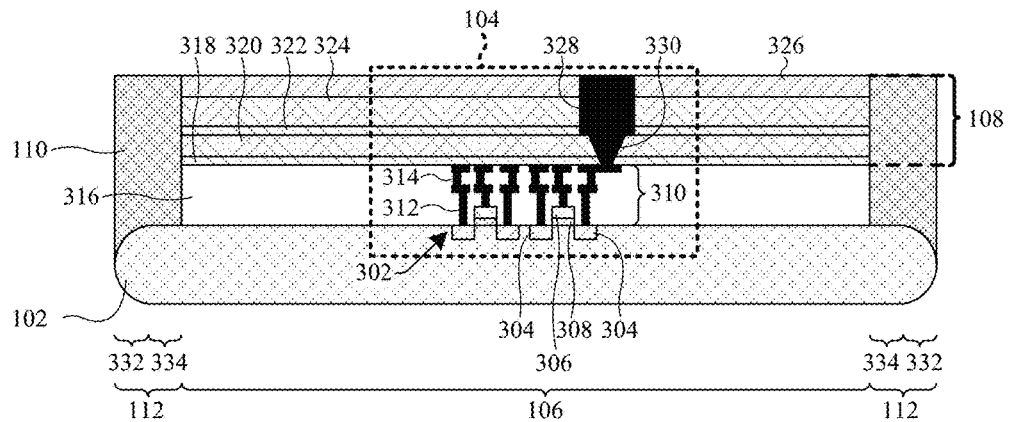
FIG. 3 illustrates a cross-sectional view of some more detailed embodiments of at least one of the semiconductor wafers of FIG. 1.

FIG. 3 illustrates a cross-sectional view of some more detailed embodiments of at least one of the semiconductor wafers of FIG. 1. While FIG. 3 illustrates a single 2D IC 104, it will be appreciated that the 2D IC 104 may be one of a plurality of 2D ICs (see, e.g., FIG. 1).

As shown in FIG. 3, a 2D IC 104 comprises a plurality of semiconductor devices 302 (e.g., a transistor). In some embodiments, each of the semiconductor devices 302 comprise a pair of source/drain regions 304 disposed in the semiconductor wafer 102. In such embodiments, each of the semiconductor devices 302 comprise a gate electrode 306 stacked on a gate dielectric 308 and disposed between the source/drain regions 304. In further embodiments, the semiconductor wafer 102 comprises any type of semiconductor body (e.g., monocrystalline silicon/CMOS bulk, silicon-germanium (SiGe), silicon on insulator (SOI), etc.).

An interconnect structure 310 is disposed over the semiconductor wafer 102 and the semiconductor devices 302. The interconnect structure 310 comprises a plurality of conductive contacts 312 and a plurality of conductive features 314 (e.g., conductive lines and conductive vias) disposed in a plurality of stacked interlayer dielectric (ILD) layers 316. The interconnect structure 310 is configured to provide electrical connection between various semiconductor devices 302 to form electrical circuits for the 2D IC 104. In some embodiments, the interconnect structure 310 may be disposed over the central region 106 of the semiconductor wafer 102 and laterally separated from outermost edges of the semiconductor wafer 102 by non-zero distances.

In some embodiments, the plurality of stacked ILD layers 316 may comprise one or more of a low-k dielectric layer (e.g., a dielectric with a dielectric constant less than about 3.9), an ultra-low-k dielectric layer, an oxide (e.g., silicon dioxide ($SiO_2$)), or the like. In further embodiments, the conductive contacts 312 may comprise, for example, tungsten, copper, or the like. In further embodiments, the conductive features 314 may comprise, for example, copper, aluminum, or the like. In further embodiments, the plurality of stacked ILD layers 316 may have a substantially planar upper surface. In yet further embodiments, the plurality of stacked ILD layers 316 may be disposed over the central region 106 of the semiconductor wafer 102 and laterally separated from outermost edges of the semiconductor wafer 102 by non-zero distances.

A bonding structure 108 is disposed over the interconnect structure 310. In some embodiments, the bonding structure 108 comprises a first etch stop layer 318 disposed on the plurality of stacked ILD layers 316 and uppermost conductive features 314 (e.g., an uppermost conductive line). In further embodiments, the first etch stop layer 318 is a different material than the plurality of stacked ILD layers 316 and may comprise, for example, silicon nitride (SiN). In further embodiments, the first etch stop layer 318 may have a substantially planar upper surface. In yet further embodiments, the bonding structure 108 may be disposed over the central region 106 of the semiconductor wafer 102 and laterally separated from outermost edges of the semiconductor wafer 102 by non-zero distances.

In some embodiments, a bonding structure dielectric layer 320 is disposed on the first etch stop layer 318. In further embodiments, the bonding structure dielectric layer 320 is a different material than the first etch stop layer 318 and may comprise, for example, an oxide (e.g., $SiO_2$), a low-k dielectric, an ultra-low-k dielectric, or the like. In further embodiments, the bonding structure dielectric layer 320 may comprise the same material as the plurality of stacked ILD layers 316. In other embodiments, the bonding structure dielectric layer 320 may comprise a different material than the plurality of stacked ILD layers 316. In further embodiments, the bonding structure dielectric layer 320 may have a substantially planar upper surface.

In some embodiments, a second etch stop layer 322 is disposed on the bonding structure dielectric layer 320. In further embodiments, the second etch stop layer 322 is a different material than the bonding structure dielectric layer 320 and may comprise, for example, SiN. In further embodiments, the second etch stop layer 322 may be the same material as the first etch stop layer 318. In yet further embodiments, the second etch stop layer 322 may have a substantially planar upper surface.

In some embodiments, a redistribution dielectric layer 324 is disposed on the second etch stop layer 322. In further embodiments, the redistribution dielectric layer 324 is a different material than the second etch stop layer 322 and may comprise, for example, an oxide (e.g., $SiO_2$), a low-k dielectric, an ultra-low-k dielectric, or the like. In yet further embodiments, the redistribution dielectric layer 324 may have a substantially planar upper surface.

In some embodiments, a bonding interface dielectric layer 326 is disposed on the redistribution dielectric layer 324. In further embodiments, the bonding interface dielectric layer 326 is a different material than the redistribution dielectric layer 324 and may comprise, for example, an oxy-nitride (e.g., silicon oxy-nitride (SiON)), a nitride (e.g., SiN), an oxide (e.g., $SiO_2$), or the like. In yet further embodiments, the bonding interface dielectric layer 326 may have a substantially planar upper surface.

Further, the bonding structure 108 comprises a conductive bonding link 328 and a conductive bonding via 330. In some embodiments, the conductive bonding link 328 extends from an upper surface of the bonding interface dielectric layer 326, through the bonding interface dielectric layer 326, through the redistribution dielectric layer 324, and through the second etch stop layer 322 to an upper surface of the bonding structure dielectric layer 320. In further embodiments, an upper surface of the conductive bonding link 328 is substantially planar with the upper surface of the bonding interface dielectric layer 326. In yet further embodiments, the conductive bonding link 328 may comprise, for example, copper, aluminum, tungsten, some other conductive material, or a combination of the forgoing. While FIG. 3 illustrates a single conductive bonding link 328, it will be appreciated that the bonding structure 108 may comprise multiple conductive bonding links.

The conductive bonding via 330 extends from the conductive bonding link 328 to the conductive features 314, such that the conductive bonding link 328 is electrically coupled to the conductive features 314. In some embodiments, the conductive bonding via 330 extends through the bonding structure dielectric layer 320 and the first etch stop layer 318 to contact an uppermost conductive feature 314 (e.g., an uppermost conductive line). In further embodiments, the conductive bonding via 330 comprises for example, copper, aluminum, tungsten, some other conductive material, or a combination of the forgoing. In further embodiments, the conductive bonding via 330 may comprise the same material as the conductive bonding link 328. In other embodiments, the conductive bonding via 330 may comprise a different material than the conductive bonding link 328. While FIG. 3 illustrates a single conductive bonding via 330, it will be appreciated that the bonding structure 108 may comprise multiple conductive bonding vias, each of which electrically couples a conductive bonding link 328 to a conductive feature 314 (e.g., an uppermost conductive line). Further, it will be appreciated that redistribution conductive lines (not shown) may be disposed in the redistribution dielectric layer 324, such that the conductive bonding via 330 and/or the conductive bonding link 328 may be disposed in different locations while still being electrically coupled to a conductive feature 314.

Also shown in FIG. 3, in some embodiments, the peripheral regions 112 of the semiconductor wafer 102 comprise bevel regions 332, respectively located along opposite outer edges of the semiconductor wafer 102. In some embodiments, the outer edges of the semiconductor wafer 102 have a rounded profile, a bullet-shaped profile, or the like. In further embodiments, the peripheral regions 112 comprise inner peripheral regions 334, respectively. The inner peripheral regions 334 separate the bevel regions 332 from the central region 106 of the semiconductor wafer 102.

In some embodiments, a width (e.g., a distance between opposite peripheral regions 112) of the central region 106 of the semiconductor wafer 102 may be between about 92 percent of a width of the semiconductor wafer 102 and about 99.8 percent of the width of the semiconductor wafer 102. More specifically, in further embodiments, the width of the central region 106 of the semiconductor wafer 102 may be about 94 percent of the width of the semiconductor wafer 102. In further embodiments, widths of the peripheral regions 112 (e.g., a distance between the central region 106 and an edge of the semiconductor wafer 102) may be between about 0.1 percent of the width of the semiconductor wafer 102 and about 4 percent of the width of the semiconductor wafer 102, respectively, such that the combined widths of opposite peripheral regions 112 may be between about 0.2 percent of the width of the semiconductor wafer and about 8 percent of the width of the semiconductor wafer 102. More specifically, in further embodiments, the widths of the peripheral regions 112 may be about 3 percent of the width of the semiconductor wafer 102, respectively, such that the combined widths of opposite peripheral regions 112 may be about 6 percent of the width of the semiconductor wafer 102.

The plurality of stacked ILD layers 316 have a smaller thickness (e.g., a substantially zero thickness) along edges of the semiconductor wafer 102 than in a central region 106 of the semiconductor wafer 102. To prevent inadequate structural support when the semiconductor wafer 102 is bonded to another wafer (e.g., as shown in FIG. 1), bonding support structures 110 are disposed on the semiconductor wafer 102. The bonding support structures 110 may comprise a layer of dielectric material arranged along opposing sides of the plurality of stacked ILD layers 316 over the peripheral regions 112 of the semiconductor wafer 102, respectively. In some embodiments, the layer of dielectric material may extend from the semiconductor wafer 102 to an upper surface of the bonding structure 108. In other embodiments, the layer of dielectric material may have an upper surface above or below the upper surface of the bonding structure 108. The layer of dielectric material is devoid of conductive interconnect layers (e.g., interconnect wires and/or vias) and/or redistribution layers.

In some embodiments, the bonding support structures 110 extend laterally from opposite outer edges of the semiconductor wafer 102 to the central region 106 of the semiconductor wafer 102. In such embodiments, each of the bonding support structures 110 are disposed over one of the bevel regions 332 and one of the inner peripheral regions 334. For example, one of the bonding support structures 110 may be disposed over one of the bevel regions 332 and one of the inner peripheral regions 334, and another one of the bonding support structures 110 may be disposed over another one of the bevel regions 332 opposite the one of the bevel regions 332 and over another one of the inner peripheral regions 334 opposite the one of the inner peripheral regions 334. In further embodiments, the bonding support structures 110 may be disposed over the peripheral regions 112 of the semiconductor wafer 102 and laterally separated from outermost edges of the semiconductor wafer 102 by non-zero distances.

In some embodiments, the bonding support structures 110 extend vertically from an upper surface of the semiconductor wafer 102 along opposite sidewalls of the plurality of stacked ILD layers 316 and opposite sidewalls of the bonding structure 108. In further embodiments, the bonding support structures 110 may contact the semiconductor wafer 102, the plurality of stacked ILD layers 316, the first etch stop layer 318, the bonding structure dielectric layer 320, the second etch stop layer 322, the redistribution dielectric layer 324, and the bonding interface dielectric layer 326. In further embodiments, upper surfaces of the bonding support structures 110 may be substantially planar with the upper surface of the bonding interface dielectric layer 326 and/or the conductive bonding link 328, such that the bonding structure 108 and the bonding support structures 110 provide a substantially planar upper surface between opposite edges of the semiconductor wafer 102. In further embodiments, outer sidewalls of the bonding support structures 110 may be substantially vertical. In further embodiments, the outer sidewalls of the bonding support structures 110 may be vertically aligned with opposite outer edges of the semiconductor wafer 102, respectively.

In some embodiments, the bonding support structures 110 may comprise, for example, an oxide (e.g., SiO2), a nitride (e.g., SiN), an oxy-nitride (e.g., SiON), a carbide (e.g., silicon carbide (SiC)), some other dielectric, or a combination of the foregoing. In further embodiments, the bonding support structures 110 may have a height (e.g., a distance from a bottom surface of a bonding support structure 110 to an upper surface of the bonding support structure 110) between about 200 angstrom (Å) and about 10 micrometers (μm). In further embodiments, the bonding support structures 110 may have substantially similar heights. In other embodiments, the bonding support structures 110 may have different heights.

More specifically, in some embodiments, the bonding support structures 110 may comprise $SiO_2$ and have a height between about 1000 Å and about 4 μm or a height between about 4.1 μm and about 10 μm. In further embodiments, the bonding support structures 110 may comprise SiON and have a height between about 1000 Å and about 4 μm or a height between about 4.1 μm and about 10 μm. In further embodiments, the bonding support structures 110 may comprise SiN and have a height between about 500 Å and about 3 μm or a height between about 3.1 μm and about 9 μm. In further embodiments, the bonding support structures 110 may comprise SiC and have a height between about 200 Å and about 2 μm or a height between about 2.1 μm and about 5 μm. In yet further embodiments, the heights of the bonding support structures 110 may vary (e.g., by up to about 20,000 Å) across the widths of the bonding support structures 110, respectively.

The differences in materials, widths, and heights of the bonding support structures 110 provides the ability to tune the bonding support structures 110 to reduce different α-step profiles (e.g., a difference in height between an uppermost layer disposed over the central region 106 and an uppermost layer disposed over the peripheral regions 112) that may exist between the central region 106 of the semiconductor wafer 102 and the peripheral regions 112. Thus, even though the α-step profile may vary between different semiconductor wafers, the NB areas over the semiconductor wafers may be reduced.

In some embodiments, the bonding support structures 110 may have a refractive index (RI) greater than undoped silicon glass (USG). In further embodiments, the RI of the bonding support structures 110 may be between about 1.65 and about 1.45. More specifically, in further embodiments, the RI of the bonding support structures 110 may be about 1.6. The different RIs provide the ability to tune the amount of incident radiation (e.g., photons) that propagates through the bonding support structures 110. Thus, the performance of the 2D IC 104 may be improved by allowing/preventing a predetermined amount of incident radiation to propagate through the bonding support structures 110.

In some embodiments, an etch rate of the bonding support structures 110 may be different than the bonding interface dielectric layer 326, the conductive bonding link 328, the I/O dielectric layer 118 (see, e.g., FIG. 2), and/or the I/O conductive contacts 116 (see, e.g., FIG. 2). In other embodiments, the etch rate of the bonding support structures 110 may be about the same as the bonding interface dielectric layer 326, the conductive bonding link 328, the I/O dielectric layer 118, and/or the I/O conductive contacts 116. In further embodiments, the bonding support structures 110 may have a lower etch rate than USG. The different etch rates provide the ability to tune the rate at which the bonding support structures 110 are etched. Thus, etching processes (e.g., wafer clean processes) may be performed (e.g., before or after bonding) after the bonding support structures 110 are formed without excessively/inadequately etching the bonding support structures 110 in relation to the bonding interface dielectric layer 326, the conductive bonding link 328, the I/O dielectric layer 118, and/or the I/O conductive contacts 116.

Figure 4:
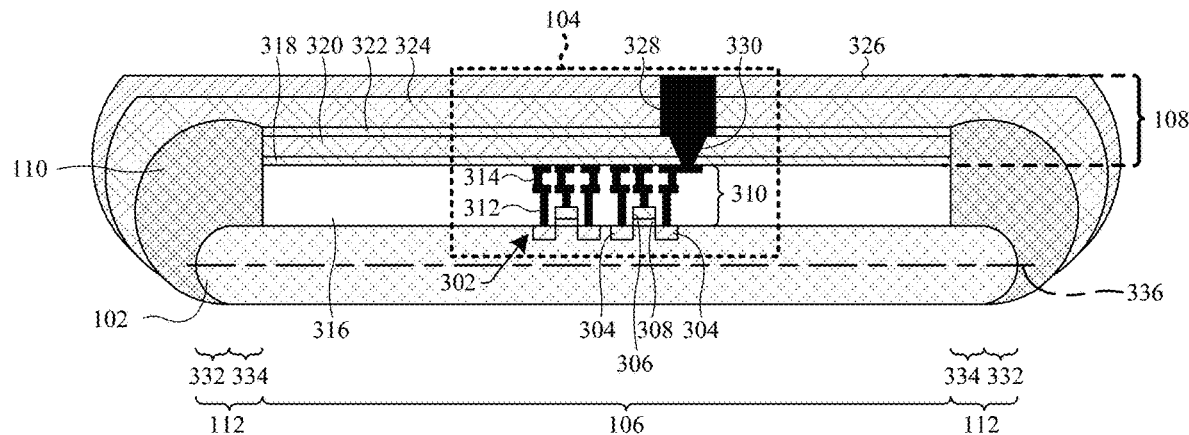
FIG. 4 illustrates a cross-sectional view of some more detailed embodiments of at least one of the semiconductor wafers of FIG. 1.

FIG. 4 illustrates a cross-sectional view of some more detailed embodiments of at least one of the semiconductor wafers of FIG. 1.

As shown in FIG. 4, in some embodiments, the bonding support structures 110 are substructures in which portions of the bonding structure 108 are disposed. Because the bonding support structures 110 are substructures in which portions of the bonding structure 108 are disposed, an uppermost surface of the bonding structure 108 may have a substantially planar upper surface that extends over the bonding support structures 110 and between (or beyond) opposite edges of the semiconductor wafer 102.

In some embodiments, uppermost surfaces of the bonding support structures 110 are spaced from a front-side (see, e.g., FIG. 2) of the semiconductor wafer 102 by at least about a same distance as an uppermost surface of the interconnect structure 310 is spaced from the front-side of the semiconductor wafer 102. In further embodiments, the uppermost surfaces of the bonding support structures 110 are disposed over an uppermost surface of the second etch stop layer 322. In yet further embodiments, outermost surfaces of each of the bonding support structures 110 are spaced from the central region 106 of the semiconductor wafer 102 by a greater distance than the edges of the semiconductor wafer 102 are spaced from the central region 106 of the semiconductor wafer 102.

In some embodiments, the bonding support structures 110 may have rounded outer sidewalls (e.g., facing away from the central region 106). In further embodiments, the rounded outer sidewalls extend from about an upper surface of the second etch stop layer 322 along a radius of curvature to below a mid-line axis 336 of the semiconductor wafer 102, where the mid-line axis 336 extends laterally through the semiconductor wafer 102 and is spaced evenly from the front-side of the semiconductor wafer 102 and the back-side (see, e.g., FIG. 2) of the semiconductor wafer 102.

In some embodiments, the redistribution dielectric layer 324 is disposed on the second etch stop layer 322 and the bonding support structures 110. In further embodiments, the redistribution dielectric layer 324 may have a substantially planar bottom surface over the central region 106 of the semiconductor wafer 102 and may have rounded inner sidewalls that line the bonding support structures 110 over the peripheral regions 112 of the semiconductor wafer 102. In further embodiments, the redistribution dielectric layer 324 has a substantially planar upper surface. In further embodiments, the substantially planar upper surface of the redistribution dielectric layer 324 extends between opposite edges of the semiconductor wafer 102. In further embodiments, the upper surface of the redistribution dielectric layer 324 may extend beyond outermost surfaces of the bonding support structures 110. In further embodiments, the redistribution dielectric layer 324 may have outer sidewalls that extend beyond outer sidewalls of the bonding support structures 110. In yet further embodiments, the outer sidewalls of the redistribution dielectric layer may be rounded.

In some embodiments, the bonding interface dielectric layer 326 is disposed on the redistribution dielectric layer 324 and extends over both the central region 106 and the peripheral regions 112 of the semiconductor wafer 102. In further embodiments, the bonding interface dielectric layer 326 has a substantially planar upper surface that extends between opposite edges of the semiconductor wafer 102. In further embodiments, the upper surface of the bonding interface dielectric layer 326 may extend beyond outermost surfaces of the bonding support structures 110. In further embodiments, the bonding interface dielectric layer 326 may have outer sidewalls that extend beyond outer sidewalls of the redistribution dielectric layer 324. In yet further embodiments, the outer sidewalls of the bonding interface dielectric layer 326 may be rounded.

Figure 5:
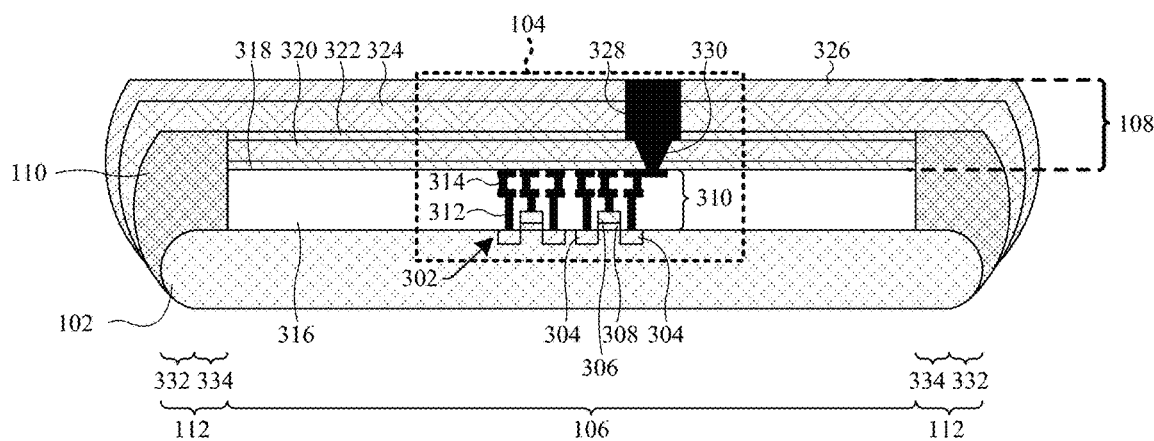
FIG. 5 illustrates a cross-sectional view of some more detailed embodiments of at least one of the semiconductor wafers of FIG. 1.

FIG. 5 illustrates a cross-sectional view of some more detailed embodiments of at least one of the semiconductor wafers of FIG. 1.

As shown in FIG. 5, in some embodiments, the bonding support structures 110 have substantially planar upper surfaces, respectively. In some embodiments, the substantially planar upper surfaces of the bonding support structures 110 are substantially planar with the upper surface of the second etch stop layer 322. In further embodiments, the substantially planar upper surfaces of the bonding support structures 110 may extend from the second etch stop layer 322 to opposite outer edges of the semiconductor wafer 102. In further embodiments, the substantially planar upper surfaces of the bonding support structures 110 may extend from the second etch stop layer beyond opposite outer edges of the semiconductor wafer 102. In yet further embodiments, the rounded outer sidewalls of the bonding support structures 110 may extend from respective planar upper surfaces of the bonding support structures 110 to below the mid-line axis (see, e.g., FIG. 4) of the semiconductor wafer 102.

Figure 6:
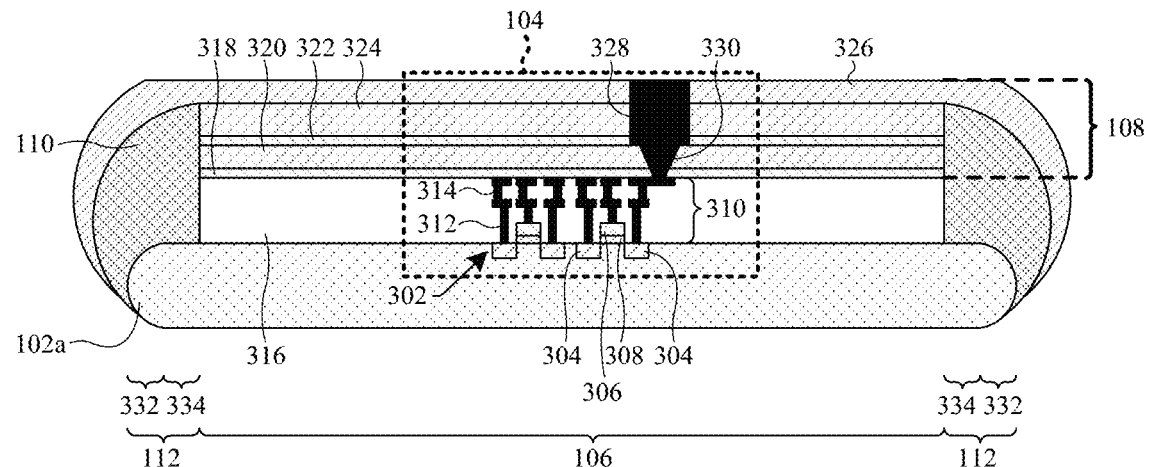
FIG. 6 illustrates a cross-sectional view of some more detailed embodiments of at least one of the semiconductor wafers of FIG. 1.

FIG. 6 illustrates a cross-sectional view of some more detailed embodiments of at least one of the semiconductor wafers of FIG. 1.

As shown in FIG. 6, in some embodiments, each of the bonding support structures 110 have rounded outer sidewalls that extend from the upper surface of the redistribution dielectric layer 324 to below the mid-line axis (see, e.g., FIG. 4) of the semiconductor wafer 102. In further embodiments, portions of the bonding interface dielectric layer 326 that are disposed over peripheral regions 112 of the semiconductor wafer 102 may be disposed below an uppermost surface of the bonding interface dielectric layer 326. In yet further embodiments, the bonding interface dielectric layer 326 may conformally line the redistribution dielectric layer 324 and the bonding support structures 110.

Figure 7:
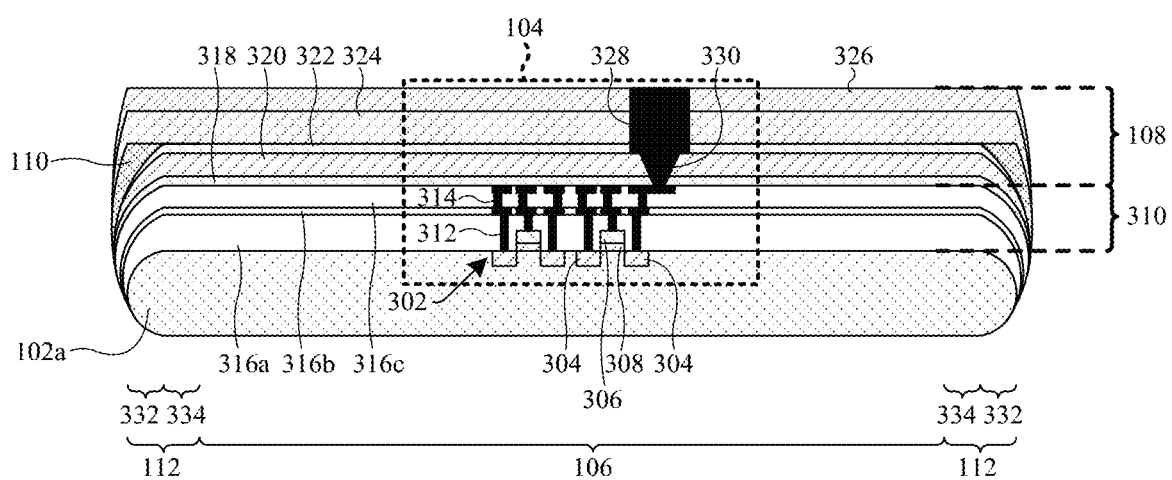
FIG. 7 illustrates a cross-sectional view of some more detailed embodiments of at least one of the semiconductor wafers of FIG. 1.

FIG. 7 illustrates a cross-sectional view of some more detailed embodiments of at least one of the semiconductor wafers of FIG. 1.

As shown in FIG. 7, in some embodiments, a plurality of ILD layers 316a-c are stacked on the semiconductor wafer 102. For example, a first ILD layer 316a is disposed on the semiconductor wafer 102, a second ILD layer 316b is disposed on the first ILD layer 316a, and a third ILD layer 316c is disposed on the second ILD layer 316b. In further embodiments, the ILD layers (e.g., the second ILD layer 316b and the third ILD layer 316c) stacked on the first ILD layer 316a may correspond to inter-metal dielectric (IMD) layers. It will be appreciated that the plurality of ILD layers 316a-c may comprise any number of ILD layers.

In some embodiments, the first ILD layer 316a, the second ILD layer 316b, the third ILD layer 316c, the first etch stop layer 318, the bonding structure dielectric layer 320, and the second etch stop layer 322 are disposed over the central region 106 and the peripheral regions 112 of the semiconductor wafer 102. In further embodiments, the first ILD layer 316a may conformally line the semiconductor wafer 102. In further embodiments, the second ILD layer 316b, the third ILD layer 316c, the first etch stop layer 318, the bonding structure dielectric layer 320, and the second etch stop layer 322 may conformally line one another. In further embodiments, the redistribution dielectric layer 324 may conformally line the second etch stop layer 322 and extend over both the central region 106 and the peripheral regions 112 of the semiconductor wafer 102. It will be appreciated that any combination of the foregoing layers (e.g., 316a-c, 318, 320, 322, and/or 324) may conformally line one another and extend over both the central region 106 and the peripheral regions 112 of the semiconductor wafer 102.

In some embodiments, the bonding support structures 110 are located in the peripheral region 112 over one or more of the ILD layers. For example, in some embodiments, the bonding support structures 110 are disposed on rounded outer sidewalls of the second etch stop layer 322. In yet further embodiments, the bonding support structures 110 may have upper surfaces that are disposed above an upper surface of the second etch stop layer 322. While FIG. 7 illustrates the bonding support structures 110 disposed on the second etch stop layer 322, it will be appreciated that the bonding support structure may be disposed on the first ILD layer 316a, the second ILD layer 316b, the third ILD layer 316c, the first etch stop layer 318, the bonding structure dielectric layer 320, or the redistribution dielectric layer 324. It will be further appreciated that upper surfaces of the bonding support structures 110 may be substantially planar with (or disposed above) an upper surface of which ever layer (e.g., 316a-c, 318, 320, or 324) the bonding support structures 110 are disposed.

Figure 8:
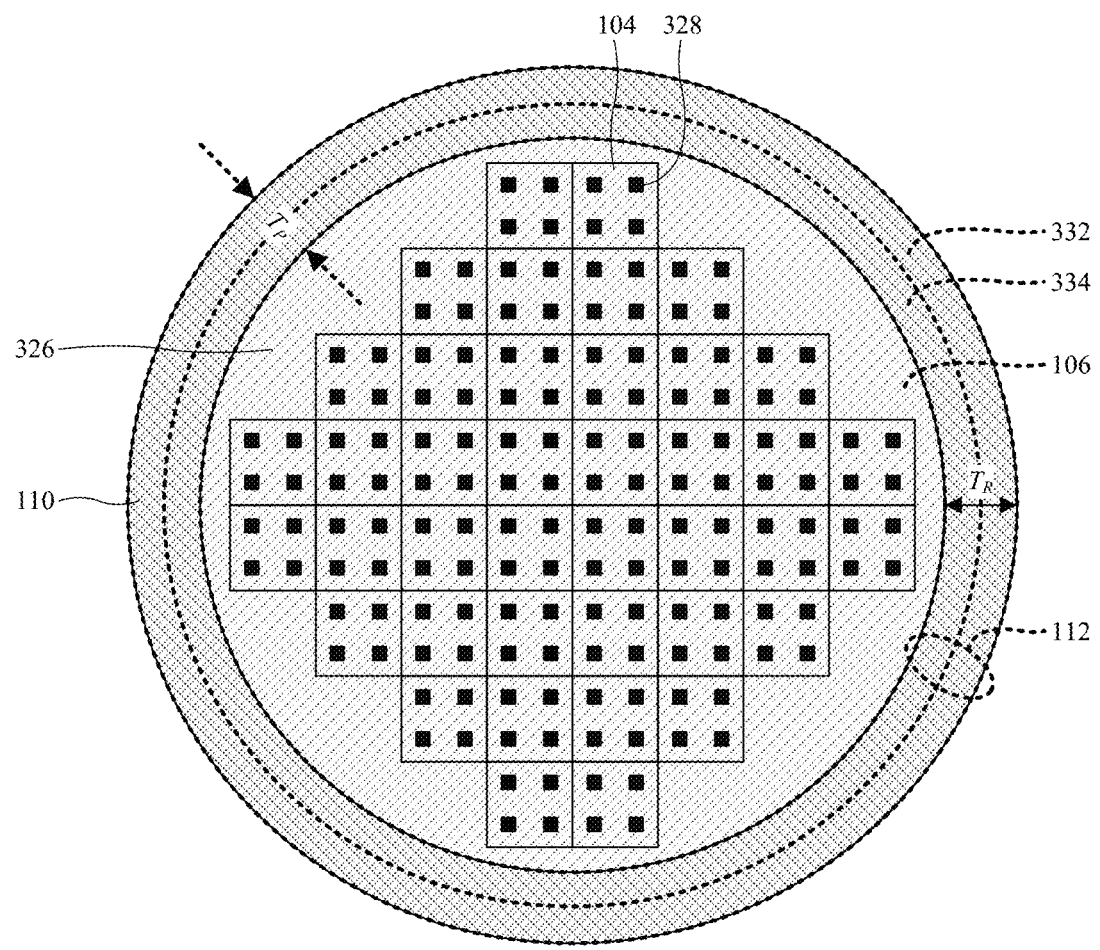
FIG. 8 illustrates a layout view of some embodiments of at least one of the semiconductor wafers of FIG. 1.

FIG. 8 illustrates a layout view of some embodiments of at least one of the semiconductor wafers of FIG. 1.

As shown in FIG. 8, in some embodiments, the semiconductor wafer 102 may correspond to a disk-shaped semiconductor wafer 102. In further embodiments, a diameter of the central region 106 of the disk-shaped semiconductor wafer 102 may be between about 92 percent of the diameter of the disk-shaped semiconductor wafer 102 and about 99.8 percent of the diameter of the disk-shaped semiconductor wafer 102. More specifically, in further embodiments, the diameter of the central region 106 of the disk-shaped semiconductor wafer 102 may be about 94 percent of the diameter of the disk-shaped semiconductor wafer 102.

In some embodiments, the peripheral regions 112 of the semiconductor wafer 102 may correspond to a ring-shaped peripheral region 112 of the semiconductor wafer 102. In further embodiments, the ring-shaped peripheral region 112 may have a ring-shaped peripheral region ring thickness, $T_P$, that is between about 0.1 percent of the diameter of the disk-shaped semiconductor wafer 102 and about 4 percent of the diameter of the disk-shaped semiconductor wafer 102. More specifically, in further embodiments, the ring-shaped peripheral region ring thickness, $T_P$, may be about 3 percent of the diameter of the disk-shaped semiconductor wafer 102. In yet further embodiments, the bevel regions 332 may correspond to a ring-shaped bevel region 332, and the inner peripheral regions 334 may correspond to a ring-shaped inner peripheral region 334.

In some embodiments, the bonding support structures 110 correspond to a ring-shaped bonding support structure 110. In further embodiments, the ring-shaped bonding support structure 110 may have a ring-shaped bonding support structure ring thickness, $T_R$, that is between about 0.1 percent of the diameter of the disk-shaped semiconductor wafer 102 and about 4 percent of the diameter of the disk-shaped semiconductor wafer 102. More specifically, in further embodiments, the ring-shaped bonding support structure ring thickness, $T_R$, may be about 3 percent of the diameter of the disk-shaped semiconductor wafer 102.

FIGS. 9A-9K illustrate a series of cross-sectional views of some embodiments of a method for forming the semiconductor wafer of FIG. 3 and bonding the semiconductor wafer of FIG. 3 to another semiconductor wafer.

Figure 9A:
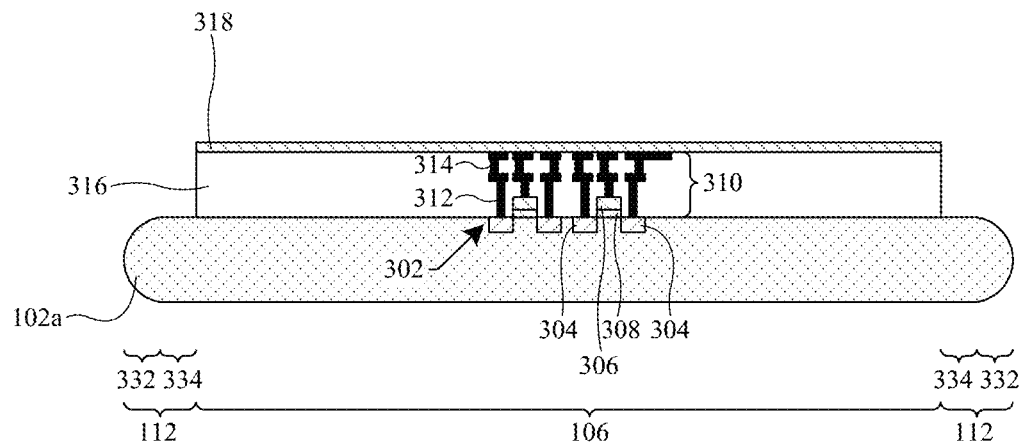
FIGS. 9A-9K illustrate a series of cross-sectional views of some embodiments of a method for forming the semiconductor wafer of FIG. 3 and bonding the semiconductor wafer of FIG. 3 to another semiconductor wafer.

As shown in FIG. 9A, a first etch stop layer 318 is formed on a plurality of stacked ILD layers 316 and on conductive features 314 disposed in the plurality of stacked ILD layers 316. In some embodiments, the first etch stop layer 318 is formed over a central region 106 of a first semiconductor wafer 102a. In further embodiments, the first etch stop layer 318 may be formed with sidewalls that are substantially aligned with sidewalls of the plurality of stacked ILD layers 316.

In some embodiments, a process for forming the first etch stop layer 318 may comprise depositing the first etch stop layer 318 on the plurality of stacked ILD layers 316 and the conductive features 314. In further embodiments, the first etch stop layer 318 may be deposited by chemical vapor deposition (CVD), physical vapor deposition (PVD), atomic layer deposition (ALD), sputtering, some other deposition process, or a combination of the foregoing. In further embodiments, a planarization process (e.g., a chemical-mechanical planarization (CMP)) may be performed on the first etch stop layer 318 to planarize an upper surface of the first etch stop layer 318.

Figure 9B:
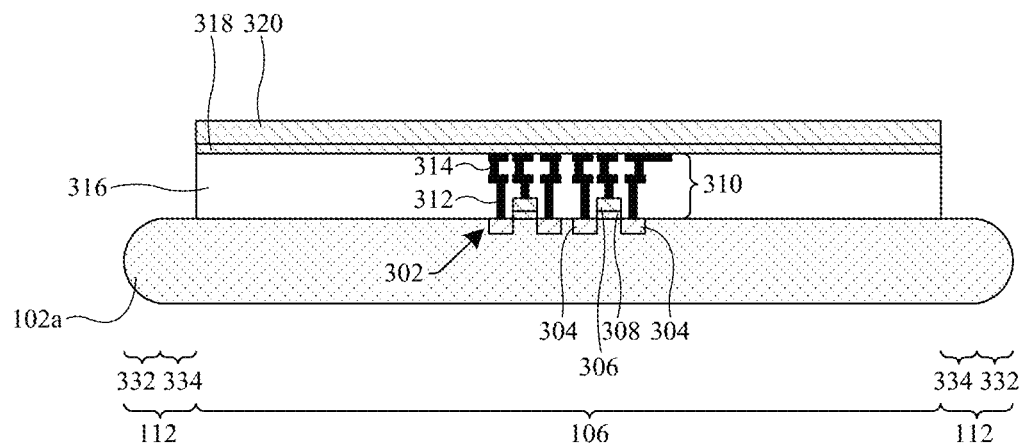

As shown in FIG. 9B, a bonding structure dielectric layer 320 is formed on the first etch stop layer 318. In some embodiments, the bonding structure dielectric layer 320 is formed over the central region 106 of the first semiconductor wafer 102a. In further embodiments, the bonding structure dielectric layer 320 may be formed with sidewalls that are substantially aligned with sidewalls of the first etch stop layer 318.

In some embodiments, a process for forming the bonding structure dielectric layer 320 may comprise depositing or growing the bonding structure dielectric layer 320 on the first etch stop layer 318. In further embodiments, the bonding structure dielectric layer 320 may be deposited or grown by CVD, PVD, ALD, sputtering, thermal oxidation, some other deposition or growth process, or a combination of the foregoing. In further embodiments, a planarization process (e.g., CMP) may be performed on the bonding structure dielectric layer 320 to planarize an upper surface of the bonding structure dielectric layer 320.

Figure 9C:
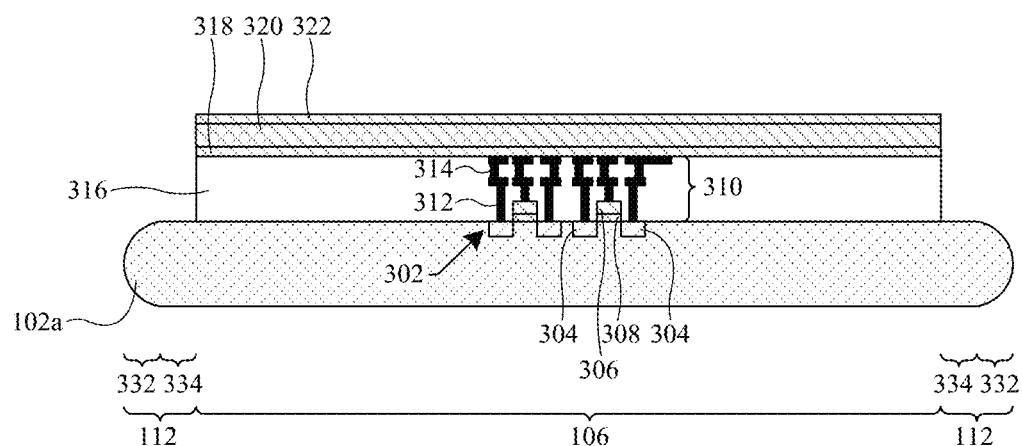

As shown in FIG. 9C, a second etch stop layer 322 is formed on the bonding structure dielectric layer 320. In some embodiments, the second etch stop layer 322 is formed over the central region 106 of the first semiconductor wafer 102a. In further embodiments, the second etch stop layer 322 may be formed with sidewalls that are substantially aligned with sidewalls of the bonding structure dielectric layer 320.

In some embodiments, a process for forming the second etch stop layer 322 may comprise depositing the second etch stop layer 322 on the bonding structure dielectric layer 320. In further embodiments, the second etch stop layer 322 may be deposited by CVD, PVD, ALD, sputtering, some other deposition process, or a combination of the foregoing. In further embodiments, a planarization process (e.g., CMP) may be performed on the second etch stop layer 322 to planarize an upper surface of the second etch stop layer 322.

Figure 9D:
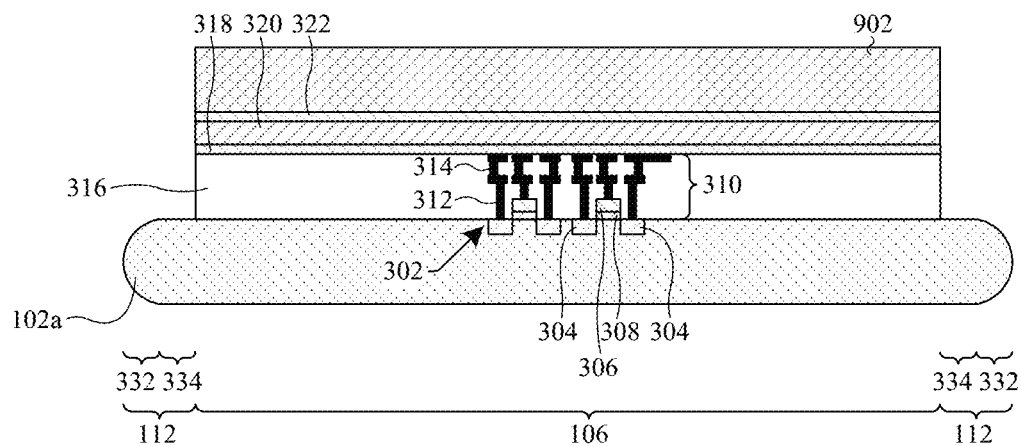

As shown in FIG. 9D, a first dielectric layer 902 is formed on the second etch stop layer 322. In some embodiments, the first dielectric layer 902 is formed over the central region 106 of the first semiconductor wafer 102a. In further embodiments, the first dielectric layer 902 may be formed with sidewalls that are substantially aligned with sidewalls of the second etch stop layer 322. In further embodiments, the first dielectric layer 902 is a different material than the second etch stop layer 322 and may comprise, for example, an oxide (e.g., $SiO_2$), a low-k dielectric, an ultra-low-k dielectric, or the like.

In some embodiments, a process for forming the first dielectric layer 902 may comprise depositing or growing the first dielectric layer 902 on the second etch stop layer 322. In further embodiments, the first dielectric layer 902 may be deposited or grown by CVD, PVD, ALD, sputtering, thermal oxidation, some other deposition or growth process, or a combination of the foregoing. In further embodiments, a masking layer (not shown) may be formed over the first dielectric layer 902 (e.g., via a photolithography process). In yet further embodiments, with the masking layer in place, an etching process (e.g., a wet etch, dry etch, etc.) may be performed on the first dielectric layer 902 to remove unmasked portions of the first dielectric layer 902 (e.g., regions of the first masking layer 902 disposed over the peripheral regions 112). In such embodiments, the masking layer may be subsequently stripped away. It will be appreciated that the above masking/etching process may be performed on the first etch stop layer 318, the bonding structure dielectric layer 320, and/or the second etch stop layer 322 to remove unmasked portions (e.g., portions disposed over the peripheral regions 112) of the first etch stop layer 318, the bonding structure dielectric layer 320, and/or the second etch stop layer 322.

Figure 9E:
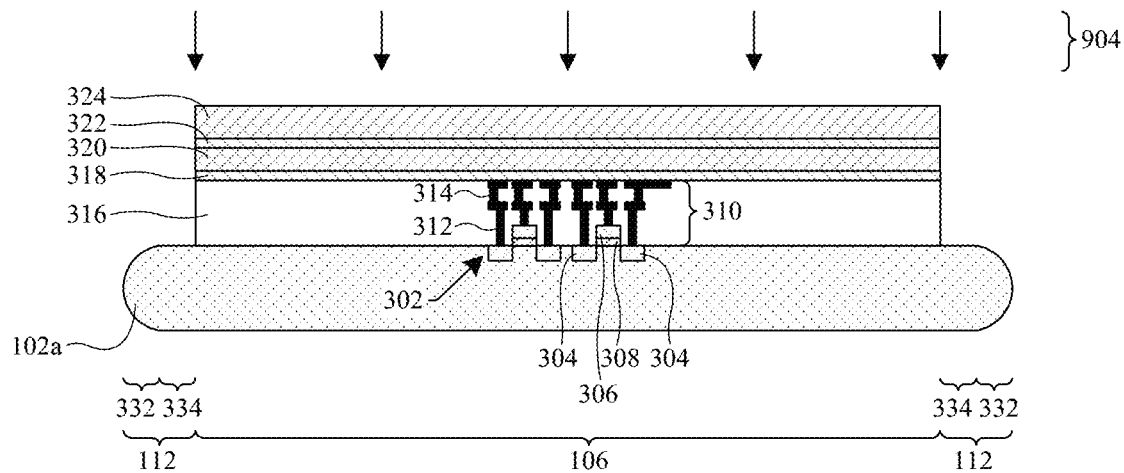

As shown in FIG. 9E, a first planarization process 904 process is performed on the first dielectric layer 902 (see, e.g., FIG. 9D) to form a redistribution dielectric layer 324 having a substantially planar upper surface. The redistribution dielectric layer 324 comprises the portion of the first dielectric layer 902 remaining after the first planarization process 904. In some embodiments, the first planarization process 904 may be a CMP process. It will be appreciated that a conductive layer (not shown) may be formed over the first dielectric layer 902 and filling redistribution conductive line openings (not shown) that are disposed in the first dielectric layer 902. It will be further appreciated that the first planarization process 904 may be performed on the conductive layer and the first dielectric layer 902 to co-planarize the upper surface of the redistribution dielectric layer 324 and the conductive layer, such that redistribution conductive lines are formed in the redistribution dielectric layer 324 with upper surfaces that are substantially planar with the upper surface of the redistribution dielectric layer 324.

Figure 9F:
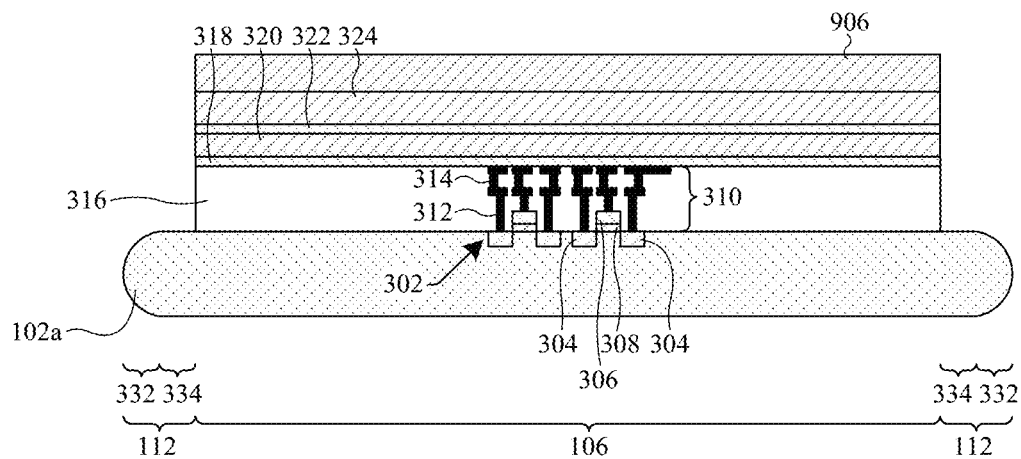

As shown in FIG. 9F, a second dielectric layer 906 is formed on the redistribution dielectric layer 324. In some embodiments, the second dielectric layer 906 is formed over the central region 106 of the first semiconductor wafer 102a. In further embodiments, the second dielectric layer 906 may be formed with sidewalls that are substantially aligned with sidewalls of the redistribution dielectric layer 324. In further embodiments, the second dielectric layer 906 is a different material than the redistribution dielectric layer 324 and may comprise, for example, an oxy-nitride (e.g., silicon oxy-nitride (SiON)), an oxide (e.g., SiO$_2$), a nitride (e.g., SiN), or the like. In further embodiments, a process for forming the second dielectric layer 906 may comprise depositing or growing the second dielectric layer 906 on the redistribution dielectric layer 324. In yet further embodiments, the second dielectric layer 906 may be deposited or grown by CVD, PVD, ALD, sputtering, thermal oxidation, some other deposition or growth process, or a combination of the foregoing.

Figure 9G:
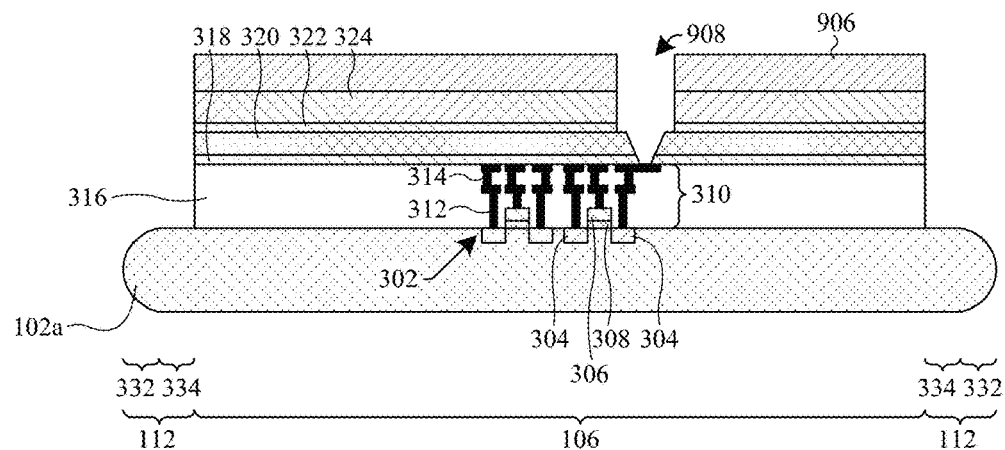

As shown in FIG. 9G, an opening 908 that extends from an upper surface of the second dielectric layer 906 to an uppermost conductive feature 314 is formed over the first semiconductor wafer 102a. In some embodiments, the opening 908 extends through the second dielectric layer 906, the redistribution dielectric layer 324, the second etch stop layer 322, the bonding structure dielectric layer 320, and the first etch stop layer 318 to the uppermost conductive feature 314. In further embodiments, the opening 908 may comprise an upper portion that extends from the upper surface of the second dielectric layer 906 to an upper surface of the bonding structure dielectric layer 320, and a lower portion that extends from the upper surface of the bonding structure dielectric layer 320 to the uppermost conductive feature 314. In such embodiments, a width of the upper portion of the opening 908 may be greater than a width of the lower portion of the opening 908. It will be appreciated that the opening 908 may be one of a plurality of openings that extend from the upper surface of the second dielectric layer 906 to uppermost conductive features 314.

In some embodiments, a process for forming the opening 908 comprises performing a selective etch into the second dielectric layer 906, the redistribution dielectric layer 324, the second etch stop layer 322, the bonding structure dielectric layer 320, and the first etch stop layer 318. In further embodiments, the selective etch comprises forming a masking layer (not shown) on the second dielectric layer 906 (e.g., via a photolithography process). Subsequently, the second dielectric layer 906 is exposed to one or more etchant(s) that remove portions of the second dielectric layer 906, the redistribution dielectric layer 324, the second etch stop layer 322, the bonding structure dielectric layer 320, and the first etch stop layer 318 not covered by the masking layer to form the opening 908. Subsequently, the masking layer may be stripped away. It will be appreciated that multiple selective etches may be performed to form the opening 908. For example, a first selective etch may be performed to form the upper portion of the opening 908, and a second selective etch may be performed to form the lower portion of the opening 908.

Figure 9H:
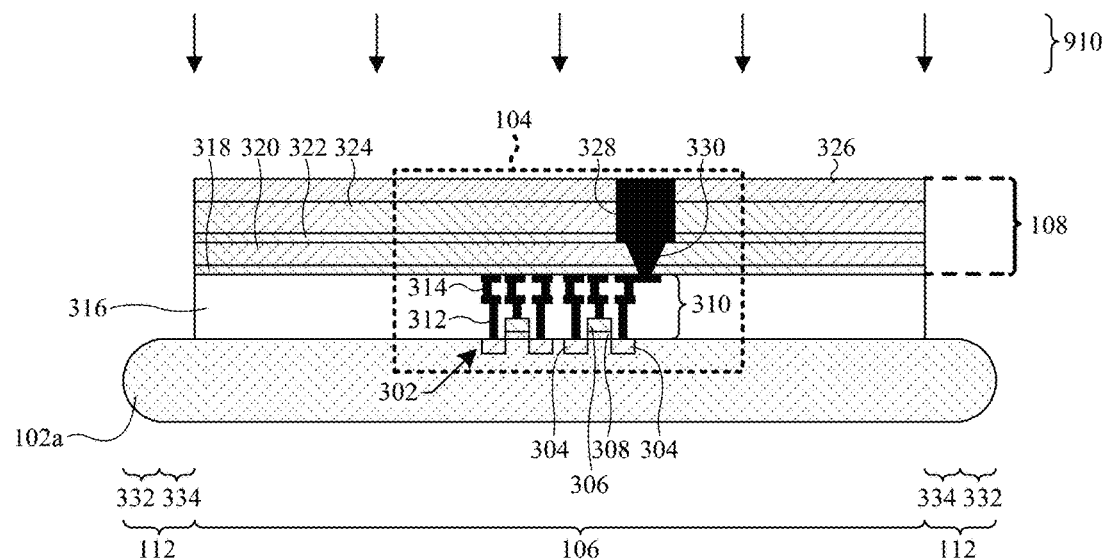

As shown in FIG. 9H, a conductive bonding via 330 and a conductive bonding link 328 are formed in the opening 908 (see, e.g., FIG. 9G). Further, a second planarization process 910 is performed on the second dielectric layer 906 (see, e.g., FIG. 9G) to form a bonding interface dielectric layer 326. The bonding interface dielectric layer 326 comprises the portion of the second dielectric layer 906 remaining after the second planarization process 910. In some embodiments, the conductive bonding via 330 may be formed in the lower portion of the opening 908, and the conductive bonding link 328 may be formed in the upper portion of the opening 908. In further embodiments, formation of the conductive bonding link 328, the conductive bonding via 330, and the bonding interface dielectric layer 326 completes formation of a bonding structure 108 and/or a 2D IC 104.

In some embodiments, a process for forming the conductive bonding via 330, the conductive bonding link 328, and the bonding interface dielectric layer 326 comprises depositing a conductive layer (not shown) that fills the opening 908 on the second dielectric layer 906. In some embodiments, the conductive layer may comprise, for example, copper, aluminum, tungsten, some other conductive material, or a combination of the forgoing. In further embodiments, the conductive layer may be formed by, for example, CVD, PVD, ALD, sputtering, electrochemical plating, electroless plating, some other deposition process, or a combination of the foregoing.

Subsequently, the second planarization process 910 is performed on the conductive layer and into the second dielectric layer 906 to form the conductive bonding via 330, the conductive bonding link 328, and the bonding interface dielectric layer 326. In some embodiments, the second planarization process 910 co-planarizes an upper surface of the conductive bonding link 328 and an upper surface of the bonding interface dielectric layer 326. In further embodiments, the second planarization process 910 may be a CMP process.

Figure 9I:
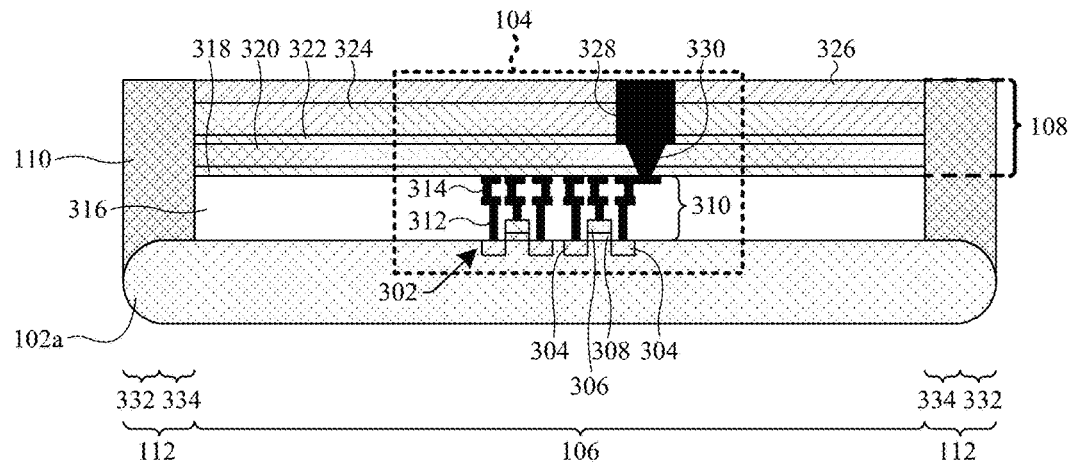

As shown in FIG. 9I, bonding support structures 110 are formed over peripheral regions 112 of the first semiconductor wafer 102a, respectively. In some embodiments, the bonding support structures 110 comprise a layer of dielectric material that is formed on the first semiconductor wafer 102a and that extends along sidewalls of the plurality of stacked ILD layers 316, the first etch stop layer 318, the bonding structure dielectric layer 320, the second etch stop layer 322, the redistribution dielectric layer 324, and the bonding interface dielectric layer 326. In further embodiments, each of the bonding support structures 110 are formed extending over an inner peripheral region 334 and a bevel region 332 of the first semiconductor wafer 102a. In further embodiments, the bonding support structures 110 are formed with upper surfaces that are substantially planar with the upper surface of the bonding interface dielectric layer 326. In further embodiments, the bonding support structures 110 may be formed with outer sidewalls that are substantially aligned with opposite outer edges of the first semiconductor wafer 102a. In yet further embodiments, the outer sidewalls of the bonding support structures 110 may be formed extending in a substantially vertical line.

In some embodiments, a process for forming the bonding support structures 110 may comprise selectively depositing or growing the bonding support structures 110 on the first semiconductor wafer 102a and over the peripheral regions 112 of the first semiconductor wafer 102a. In further embodiments, the bonding support structures 110 may be selectively deposited or grown by CVD, PVD, ALD, sputtering, thermal oxidation, some other deposition or growth process, or a combination of the foregoing. More specifically, in further embodiments, the bonding support structures 110 are selectively deposited by plasma-enhanced CVD (PECVD).

In some embodiments, the PECVD process comprises loading the first semiconductor wafer 102a into a processing chamber. Subsequently, one or more processing gas(es) are flowed into the processing chamber, such that the bonding support structures 110 may be selectively deposited over the peripheral regions 112 of the first semiconductor wafer 102a. In further embodiments, an upper plasma exclusion (PEZ) ring is aligned over a front-side (see, e.g., FIG. 2) of the first semiconductor wafer 102a and covering the central region 106 of the first semiconductor wafer 102a. The upper PEZ ring is configured to prevent the PECVD process from depositing the bonding support structures 110 over the central region 106 of the first semiconductor wafer 102a. In yet further embodiments, during the PECVD process, the upper PEZ ring may be spaced from the first semiconductor wafer 102a by about 0.3 mm to about 0.85 mm.

In some embodiments, during the PECVD process, a lower PEZ ring that extends between opposite edges of the first semiconductor wafer 102a is arranged below a back-side (see, e.g., FIG. 2) of the first semiconductor wafer 102a. The lower PEZ ring is configured to prevent the PECVD process from depositing the bonding support structures 110 on the back-side of the first semiconductor wafer 102a. In further embodiments, during the PECVD process, the lower PEZ ring may be spaced from the first semiconductor wafer 102a by about 0.3 mm to about 0.85 mm.

In some embodiments, the one or more processing gas(es) may comprise, for example, silanes (e.g., silane ($SiH_4$)), an oxide of nitrogen (e.g., nitrous oxide ($N_2O$)), nitrogen gas ($N_2$), or the like. In further embodiments, the one or more processing gas(es) may be flowed into the processing chamber at a flow rate between about 10 standard cubic centimeter per minute (sccm) and about 3000 sccm. In further embodiments, one of the processing gases is $SiH_4$ and is flowed into the processing chamber at a flow rate between about 10 sccm and about 500 sccm. More specifically, in further embodiments, $SiH_4$ may be flowed into the processing chamber at a flow rate between about 20 sccm and about 72 sccm. By changing the flow rate of $SiH_4$, the refractive index (RI) of the bonding support structures 110 may be tuned. For example, increasing the flow rate (e.g., from about 20 sccm to about 72 sccm) of $SiH_4$ may increase the RI (e.g., from about 1.475 to about 1.65, respectively) of the bonding support structures 110.

In some embodiments, one of the processing gases is $N_2$ and is flowed into the processing chamber at a flow rate between about 100 sccm and about 3000 sccm. More specifically, in further embodiments, $N_2$ may be flowed into the processing chamber at a flow rate between about 1092 sccm and about 2000 sccm. By changing the flow rate of $N_2$ the thickness of the heights of the bonding support structures 110 may be tuned. For example, decreasing the flow rate of $N_2$ (e.g., from about 2000 sccm to about 1092 sccm) may increase the height (e.g., from about 20,000 Å to about 15,000 Å) of the bonding support structures 110. In some embodiments, one of the processing gases is $N_2O$ and is flowed into the processing chamber at flow rate between about 50 sccm and about 2500 sccm.

In some embodiments, the PECVD process may comprise heating the first semiconductor wafer 102a to a temperature between about 80° C. and about 410° C. More specifically, in further embodiments, the first semiconductor wafer 102a may be heated to about 350° C. In further embodiments, a pressure of the processing chamber may be between about 0.5 Torr and about 6 Torr. More specifically, in further embodiments, the pressure of the processing chamber may be between about 0.9 Torr and about 2 Torr. In further embodiments, the PECVD process may comprise providing between about 150 watts (W) to about 800 W to a radio frequency (RF) generator to generate a plasma inside the processing chamber. In further embodiments, the PECVD process may be performed on the first semiconductor wafer 102a for about 10 seconds to about 300 seconds. In further embodiments, after the bonding support structures 110 are formed, a planarization process (e.g., CMP) may be performed on the bonding support structures 110, such that the upper surfaces of the bonding support structures 110 are substantially planar with an upper surface of the bonding structure 108. In yet further embodiments, after the bonding support structures 110 are formed, a wafer cleaning process may be performed on the first semiconductor wafer 102a.

Figure 9J:
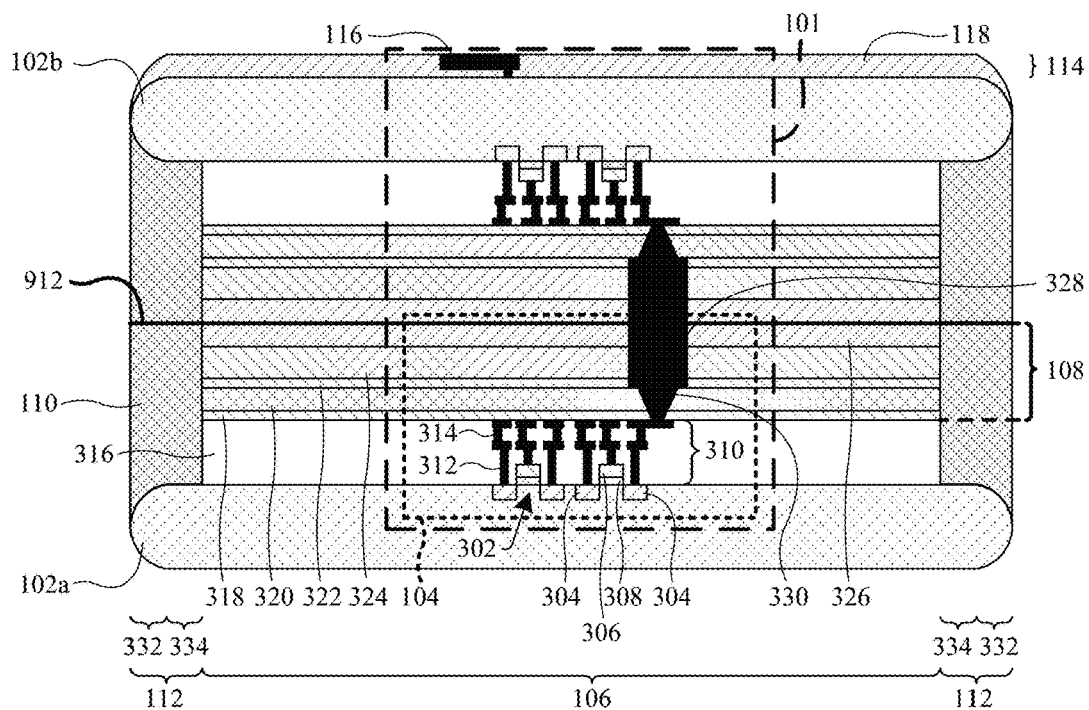

As shown in FIG. 9J, the first semiconductor wafer 102a is bonded to a second semiconductor wafer 102b to form a 3D IC 101. In some embodiments, the first semiconductor wafer 102a is bonded to the second semiconductor wafer 102b by bonding the bonding interface dielectric layer 326, the conductive bonding link 328, and the bonding support structures 110 of the first semiconductor wafer 102a to a bonding interface dielectric layer 326, a conductive bonding link 328, and bonding support structures 110 of the second semiconductor wafer 102b, respectively. In further embodiments, bonding the first semiconductor wafer 102a to the second semiconductor wafer 102b forms a bonding interface 912 along the bonding interface dielectric layers 326, the conductive bonding links 328, and the bonding support structures 110 of the first and second semiconductor wafers 102a, 102b. It will be appreciated that bonding the first semiconductor wafer 102a to the second semiconductor wafer 102b may form a plurality of 3D ICs.

In some embodiments, the bonding interface 912 comprises dielectric-to-dielectric bonds between the bonding interface dielectric layers 326 of the first and second semiconductor wafers 102a, 102b. In further embodiments, the bonding interface 912 comprises conductor-to-conductor bonds between the conductive bonding links 328 of the first and second semiconductor wafers 102a, 102b. In yet further embodiments, the bonding interface 912 comprises dielectric-to-dielectric bonds between the bonding support structures 110 of the first and second semiconductor wafers 102a, 102b.

In some embodiments, a process for bonding the first semiconductor wafer 102a to the second semiconductor wafer 102b comprises flipping (e.g., rotating 180 degrees) the second semiconductor wafer 102b, such that the bonding interface dielectric layer 326 of the second semiconductor wafer 102b faces the bonding interface dielectric layer 326 of the first semiconductor wafer 102a. Thereafter, the first semiconductor wafer 102a is bonded to the second semiconductor wafer 102b by, for example, hybrid bonding, eutectic bonding, or the like. It will be appreciated that additional semiconductor wafers may be bonded to the first semiconductor wafer 102a and/or the second semiconductor wafer 102b by a substantially similar bonding process.

Because the bonding support structures 110 are formed over the peripheral regions 112 of the first semiconductor wafer 102a, non-bond (NB) areas over the peripheral regions 112 of the first semiconductor wafer 102a may be reduced. By reducing the NB areas over the peripheral regions 112 of the first semiconductor wafer 102a, during bonding, structural support between the first semiconductor wafer 102a and the second semiconductor wafer 102b may be improved. The improved structural support may reduce unwanted mechanical stresses during bonding and/or during subsequent processing steps of the bonded together semiconductor wafers. Accordingly, the bonding support structures 110 may improve the yield of 3D ICs.

Also shown in FIG. 9J, an input/output (110) structure 114 may be formed on a side of the second semiconductor wafer 102b opposite a side of the second semiconductor wafer 102b that faces the first semiconductor wafer 102a. In some embodiments, the I/O structure 114 comprises an I/O conductive contact 116 disposed in/over an I/O dielectric layer 118. It will be appreciated that the I/O conductive contact 116 may be one of a plurality of I/O conductive contacts that are disposed in/over the I/O dielectric layer 118. It will further be appreciated that the I/O structure 114 may be formed on a side of the first semiconductor wafer 102a opposite a side of the first semiconductor wafer 102a that faces the second semiconductor wafer 102b.

In some embodiments, a process for forming the I/O structure 114 comprises depositing or growing a dielectric layer (not shown) on the side of the second semiconductor wafer 102b opposite the side of the second semiconductor wafer 102b that faces the first semiconductor wafer 102a. In some embodiments, the dielectric layer may comprise, for example, an oxide (e.g., $SiO_2$), a nitride (e.g., SiN), an oxy-nitride (e.g., SiON), or the like. In some embodiments, the dielectric layer may be deposited or grown by CVD, PVD, ALD, sputtering, thermal oxidation, some other deposition or growth process, or a combination of the foregoing.

Thereafter, an opening (not shown) is formed in the dielectric layer (e.g., via a photolithography process) that extends through the dielectric layer to a through-substrate via (TSV) (not shown). A conductive layer (not shown) is then deposited on the dielectric layer and filling the opening. In some embodiments, the conductive layer may comprise, for example, copper, aluminum, tungsten, some other conductive material, or a combination of the forgoing. In some embodiments, the conductive layer may be deposited by CVD, PVD, ALD, sputtering, electrochemical plating, electroless plating, some other deposition process, or a combination of the foregoing. Subsequently, a planarization process (e.g., CMP) is performed on the conductive layer and into the dielectric layer to form the I/O conductive contact 116 and the I/O dielectric layer 118. It will be appreciated that multiple openings may be formed in the dielectric layer and subsequently filled with the conductive layer, such that the planarization process forms a plurality of I/O conductive contacts 116 in the I/O dielectric layer 118.

Figure 9K:
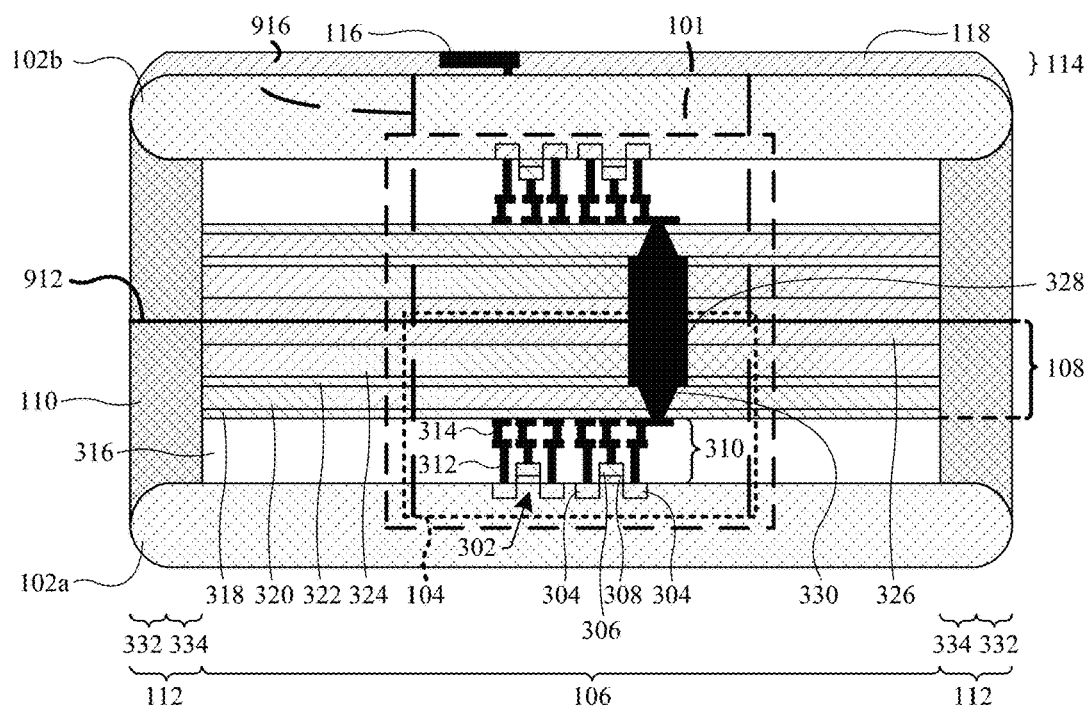

As shown in FIG. 9K, a wafer dicing process 914 is performed on the bonded together first and second semiconductor wafers 102a, 102b to singulate the 3D IC 101, thereby forming a die comprising the 3D IC 101. In some embodiments, the wafer dicing process 914 comprises performing a series of cuts into the bonded together semiconductor wafers to form a plurality of scribe lines 916, each of which are disposed on a side of the 3D IC 101. Subsequently, a mechanical force is applied to the bonded together first and second semiconductor wafers 102a, 102b to singulate the die. In further embodiments, the cut may be performed by, for example, mechanical sawing, laser cutting, or the like. It will be appreciated that the 3D IC 101 may be one of a plurality of 3D ICs, each of which are singulated from the bonded together first and second semiconductor wafers 102a, 102b by the wafer dicing process 914.

Figure 10:
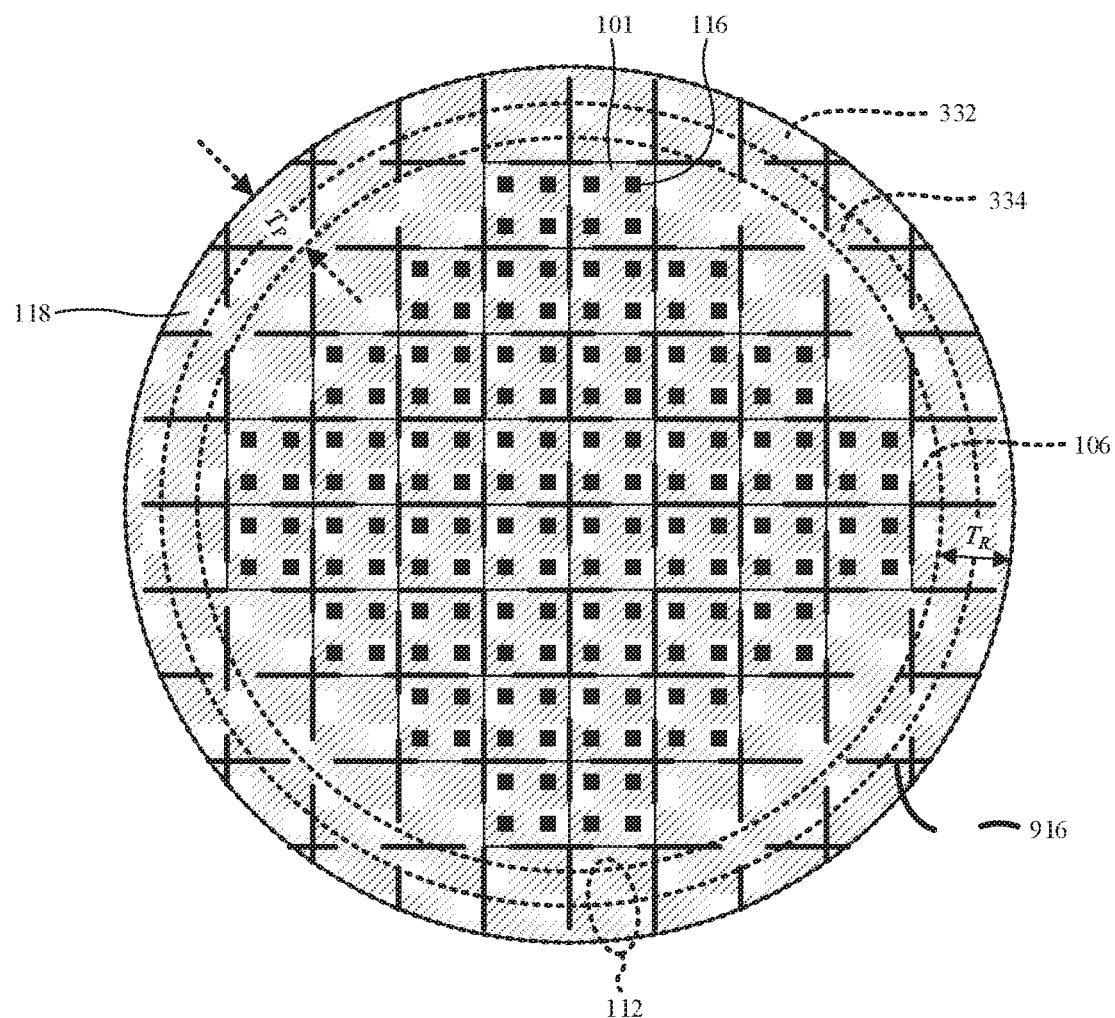
FIG. 10 illustrates a top-view of some embodiments of the wafer dicing process of FIG. 9K being performed on some embodiments of the bonded together first and second semiconductor wafers of FIGS. 9J-9K.

FIG. 10 illustrates a top-view of some embodiments of the wafer dicing process of FIG. 9K being performed on some embodiments of the bonded together first and second semiconductor wafers of FIGS. 9J-9K.

As shown in FIG. 10, the bonded together first and second semiconductor wafers 102a, 102b (see, e.g., FIGS. 9J-9K) comprises a plurality of 3D ICs 101 arranged in an array. In some embodiments, the array comprises a plurality of rows and columns. Scribe lines 916 are cut into the bonded together first and second semiconductor wafers 102a, 102b between each of the rows and columns to singulate the bonded together first and second semiconductor wafers 102a, 102b into a plurality of separate 3D ICs 101. In some embodiments, the scribe lines 916 extend completely across the bonded together first and second semiconductor wafers 102a, 102b, such that the scribe lines extend into the bonding support structures 110 of the first semiconductor wafer 102a and/or the bonding support structures of the second semiconductor wafer 102b.

In some embodiments (not shown), the scribe lines 916 defining a first one of the plurality of separate 3D ICs 101 may extend into the bonding support structure 110. In such embodiments, the first one of the plurality of separate 3D ICs 101 may have a part of the bonding support structure 110 arranged along one side of the singulated IC. For example, the first one of the plurality of separate 3D ICs 101 may have a part of the bonding support structure 110 vertically arranged between the first and second semiconductor wafers 102a, 102b.

FIGS. 11A-11I illustrate a series of cross-sectional views of some embodiments of a method for forming the semiconductor wafer of FIG. 4.

Figure 11A:
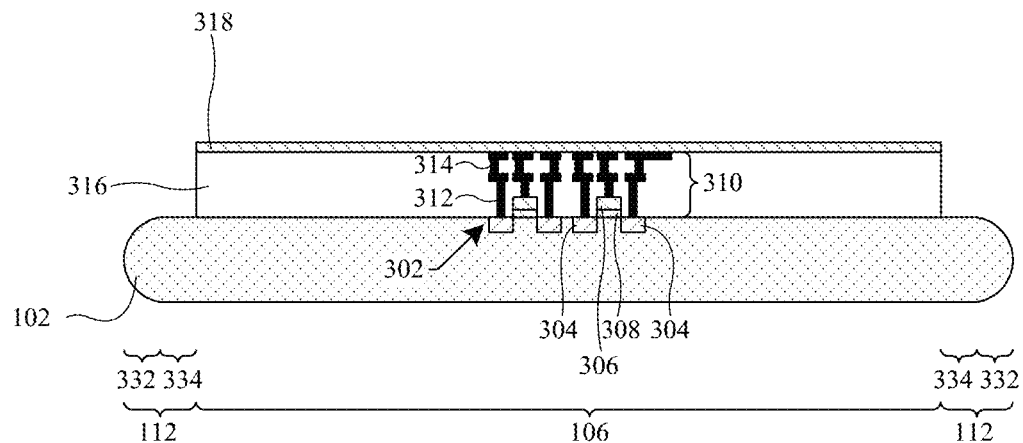
FIGS. 11A-11I illustrate a series of cross-sectional views of some embodiments of a method for forming the semiconductor wafer of FIG. 4.

As shown in FIG. 11A, a first etch stop layer 318 is formed on a plurality of stacked ILD layers 316 and on uppermost conductive features 314. In some embodiments, a process for forming the first etch stop layer 318 may be a substantially similar process as described above in reference to FIG. 9A.

Figure 11B:
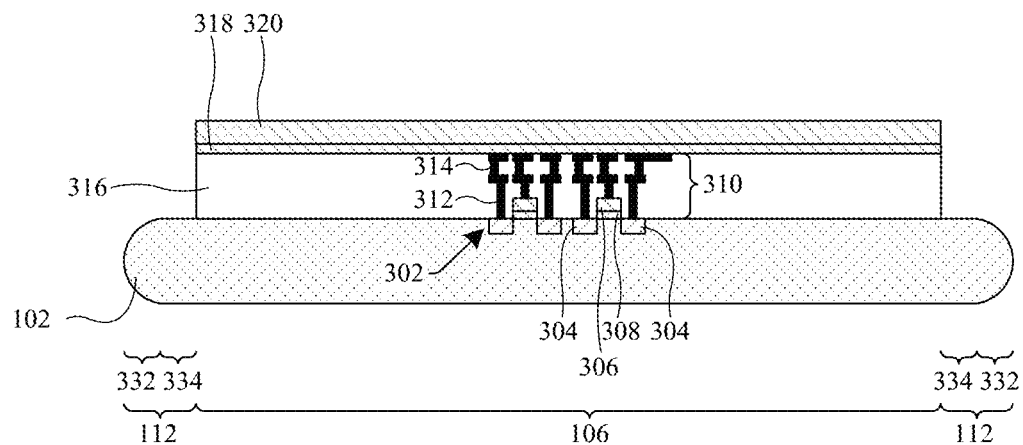

As shown in FIG. 11B, a bonding structure dielectric layer 320 is formed on the first etch stop layer 318. In some embodiments, a process for forming the bonding structure dielectric layer 320 may be a substantially similar process as described above in reference to FIG. 9B.

Figure 11C:
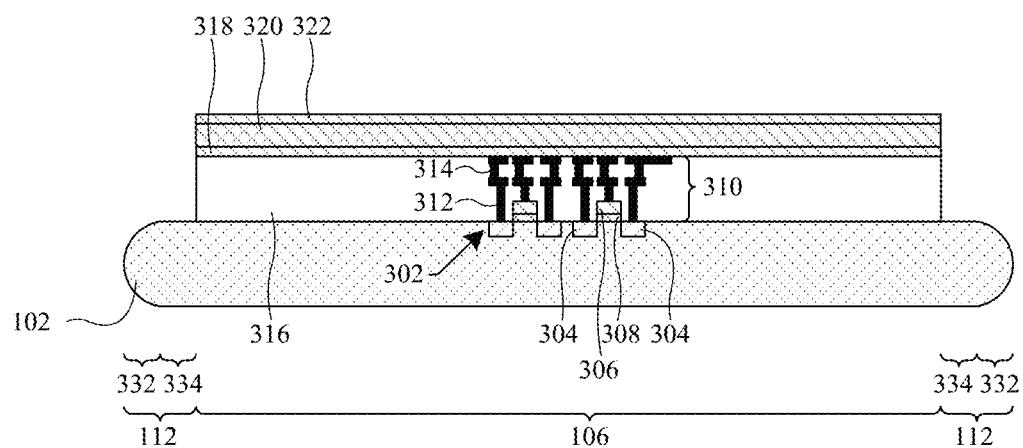

As shown in FIG. 11C, a second etch stop layer 322 is formed on the bonding structure dielectric layer 320. In some embodiments, a process for forming the second etch stop layer 322 may be a substantially similar process as described above in reference to FIG. 9C.

Figure 11D:
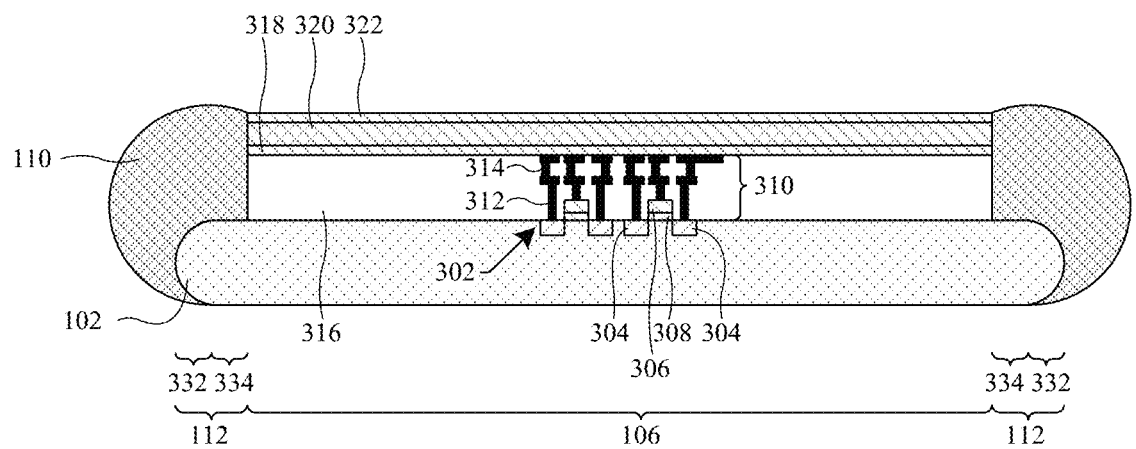

As shown in FIG. 11D, bonding support structures 110 are formed over peripheral regions 112 of a semiconductor wafer 102. In some embodiments, the bonding support structures 110 are formed with uppermost surfaces that are disposed over an uppermost surface of the second etch stop layer 322. In yet further embodiments, the bonding support structures 110 may be formed with outer sidewalls that are spaced a greater distance from the central region 106 of the semiconductor wafer 102 than edges of the semiconductor wafer 102 are spaced from the central region 106 of the semiconductor wafer 102.

In some embodiments, the bonding support structures 110 may be formed with rounded outer sidewalls. In further embodiments, the bonding support structures 110 may be formed with rounded outer sidewalls that extend from about an upper surface of the second etch stop layer 322 along a radius of curvature to below a mid-line axis (see, e.g., FIG. 4) of the semiconductor wafer 102, where the mid-line axis extends laterally through the semiconductor wafer 102 and is spaced evenly from the front-side (see, e.g., FIG. 2) of the semiconductor wafer 102 and the back-side (see, e.g., FIG. 2) of the semiconductor wafer 102. In yet further embodiments, a process for forming the bonding support structures 110 may be a substantially similar process as described above in reference to FIG. 9I.

Figure 11E:
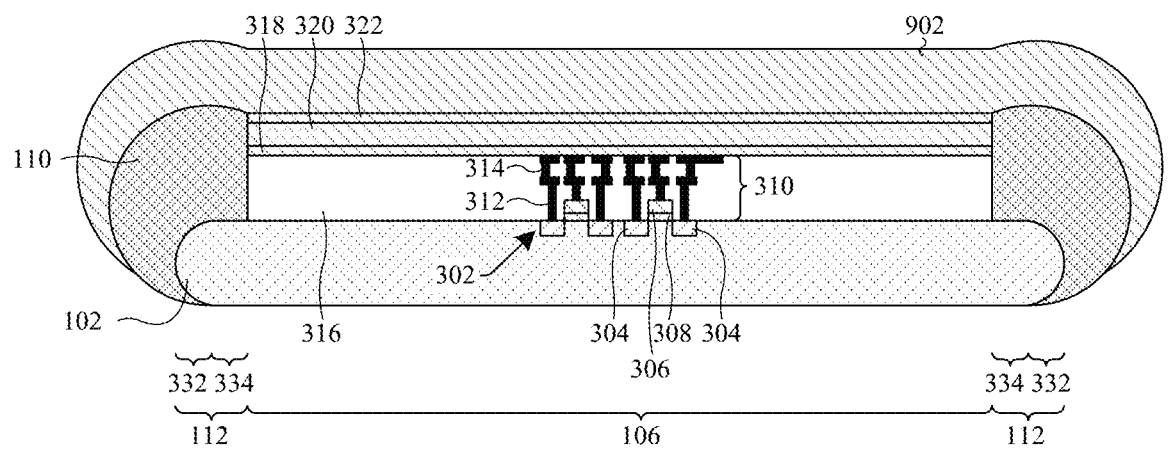

As shown in FIG. 11E, a first dielectric layer 902 is formed on the second etch stop layer 322 and on the bonding support structures 110, such that the first dielectric layer 902 is formed over both the peripheral regions 112 and the central region 106 of the semiconductor wafer 102. In some embodiments, the first dielectric layer 902 may be formed conformally lining the second etch stop layer 322 and the bonding support structures 110. In further embodiments, a process for forming the first dielectric layer 902 may be a substantially similar process as described above in reference to FIG. 9D.

Figure 11F:
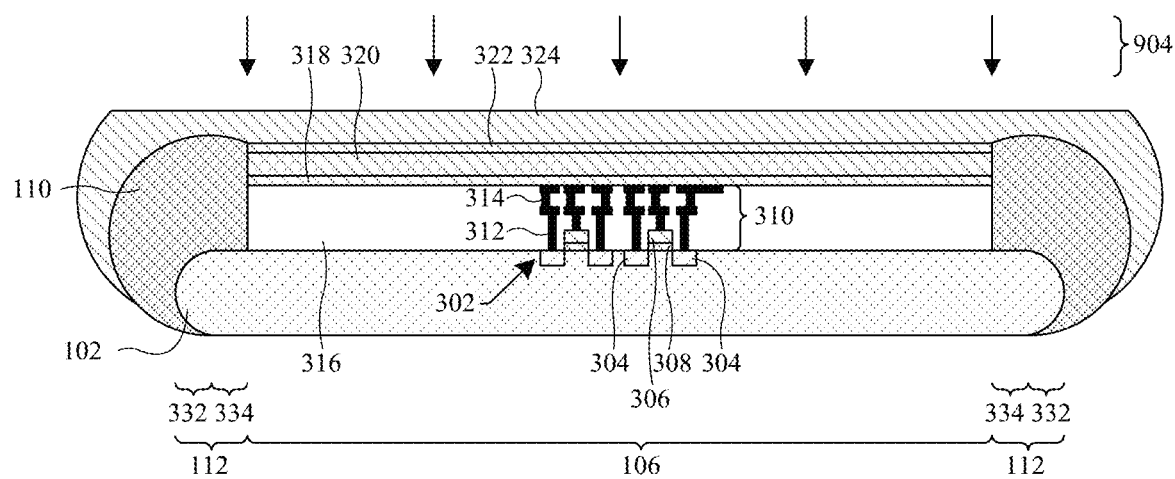

As shown in FIG. 11F, a first planarization process 904 is performed on the first dielectric layer 902 (see, e.g., FIG. 11E) to form a redistribution dielectric layer 324 having a substantially planar upper surface. In some embodiments, the first planarization process 904 may be a substantially similar process as described above in reference to FIG. 9E.

Figure 11G:
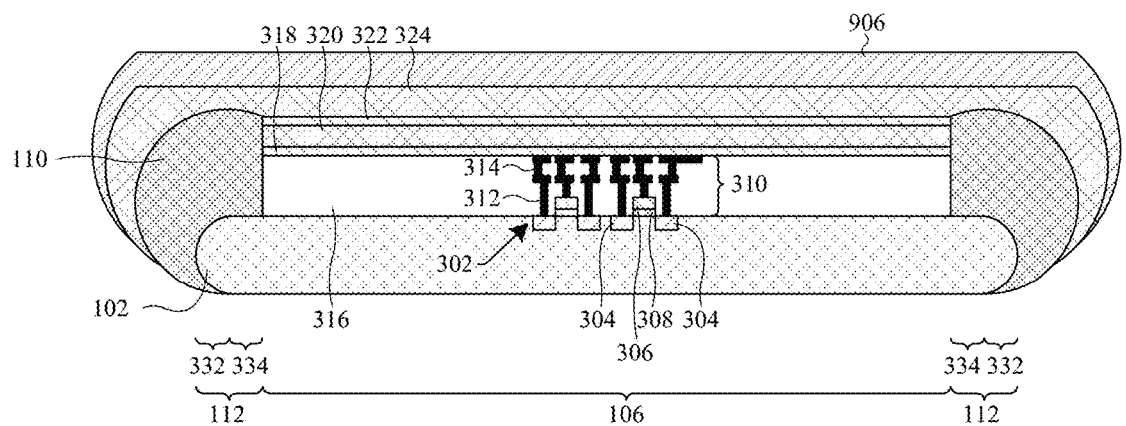

As shown in FIG. 11G, a second dielectric layer 906 is formed on the redistribution dielectric layer 324. In some embodiments, the second dielectric layer 906 is formed over both the peripheral regions 112 and the central region 106 of the semiconductor wafer 102. In further embodiments, the second dielectric layer 906 may be formed conformally lining the redistribution dielectric layer 324. In yet further embodiments, a process for forming the second dielectric layer 906 may be a substantially similar process as described above in reference to FIG. 9F.

Figure 11H:
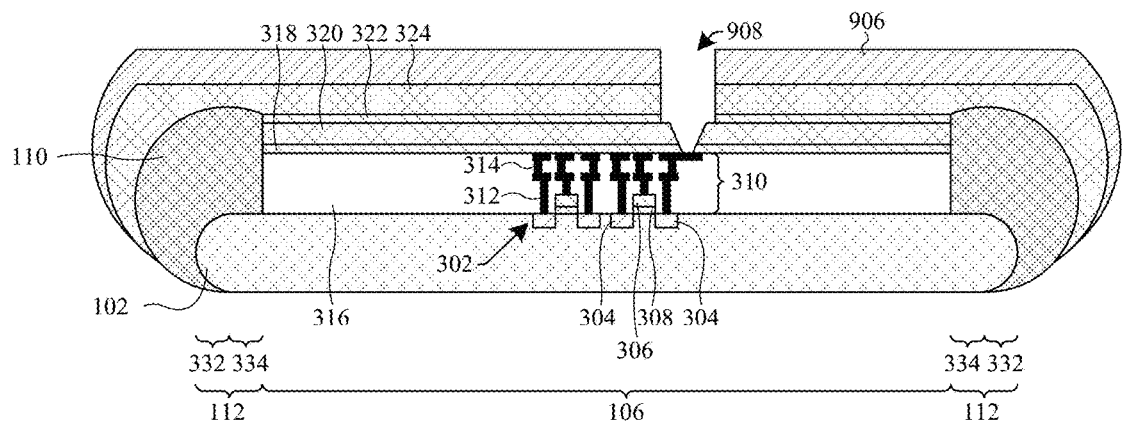

As shown in FIG. 11H, an opening 908 that extends from an upper surface of the second dielectric layer 906 to an uppermost conductive feature 314 is formed over the semiconductor wafer 102. In some embodiments, a process for forming the opening 908 may be a substantially similar process as described above in reference to FIG. 9G.

Figure 11I:
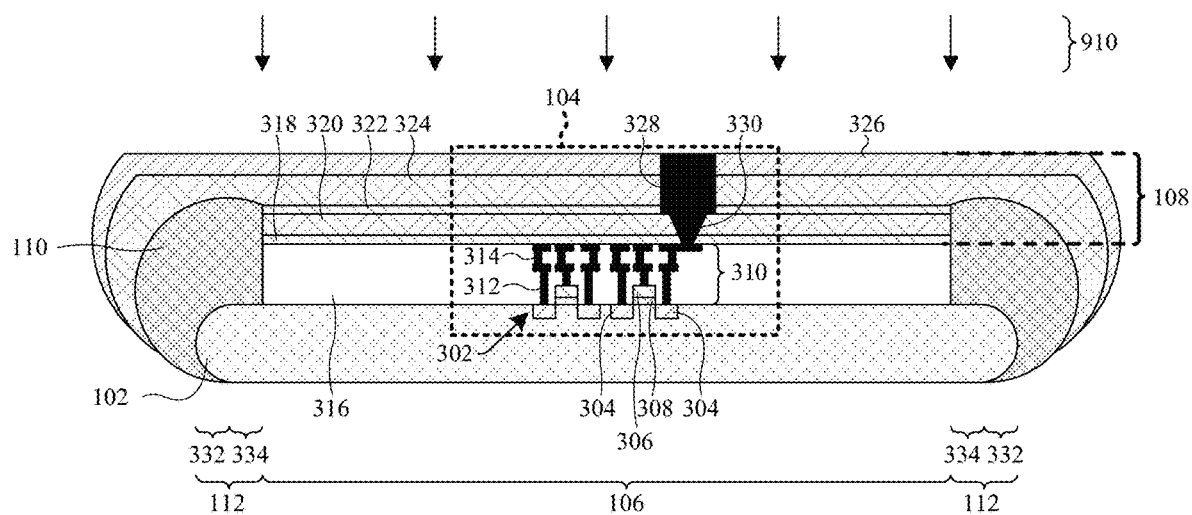

As shown in FIG. 11I, a conductive bonding via 330 and a conductive bonding link 328 are formed in the opening 908 (see, e.g., FIG. 11H). Further, a second planarization process 910 is performed on the second dielectric layer 906 (see, e.g., FIG. 11H) to form a bonding interface dielectric layer 326. In some embodiments, a process for forming the conductive bonding via 330, the conductive bonding link 328, and the bonding interface dielectric layer 326 may be a substantially similar process as described above in reference to FIG. 9H.

FIGS. 12A-12I illustrate a series of cross-sectional views of some embodiments of a method for forming the semiconductor wafer of FIG. 5.

Figure 12A:
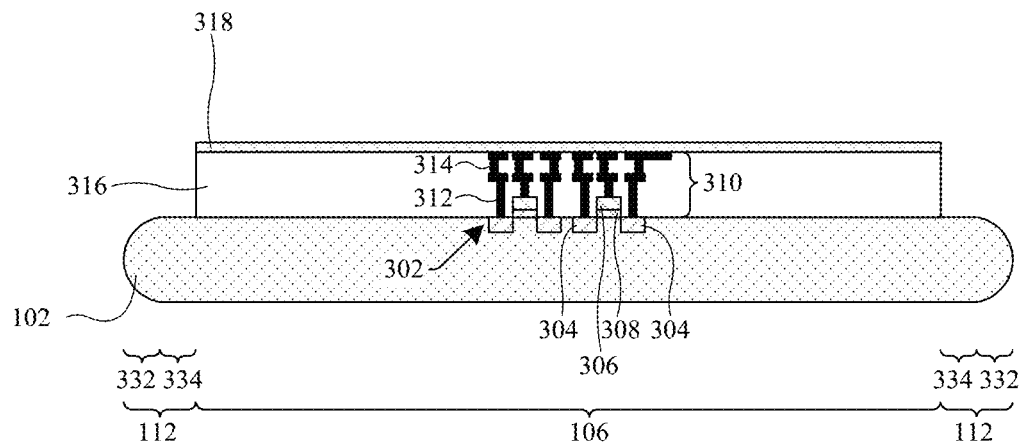
FIGS. 12A-12I illustrate a series of cross-sectional views of some embodiments of a method for forming the semiconductor wafer of FIG. 5.

As shown in FIG. 12A, a first etch stop layer 318 is formed on a plurality of stacked ILD layers 316 and on uppermost conductive features 314. In some embodiments, a process for forming the first etch stop layer 318 may be a substantially similar process as described above in reference to FIG. 9A.

Figure 12B:
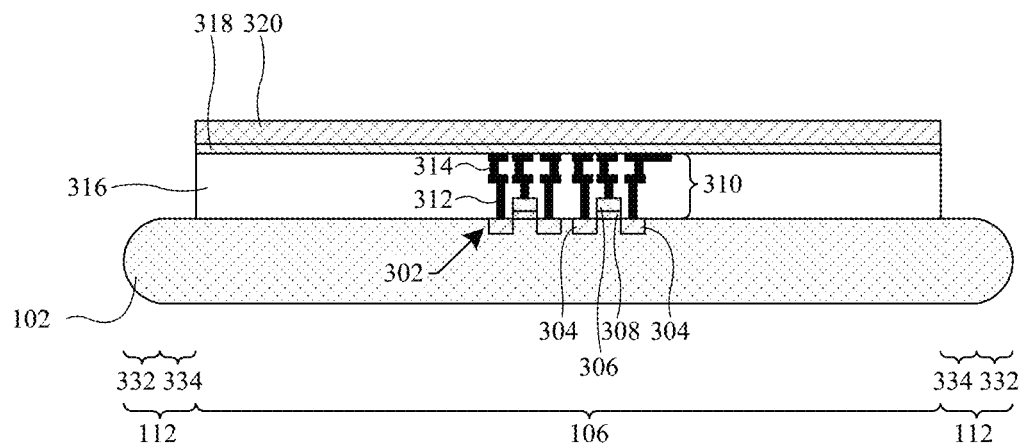

As shown in FIG. 12B, a bonding structure dielectric layer 320 is formed on the first etch stop layer 318. In some embodiments, a process for forming the bonding structure dielectric layer 320 may be a substantially similar process as described above in reference to FIG. 9B.

Figure 12C:
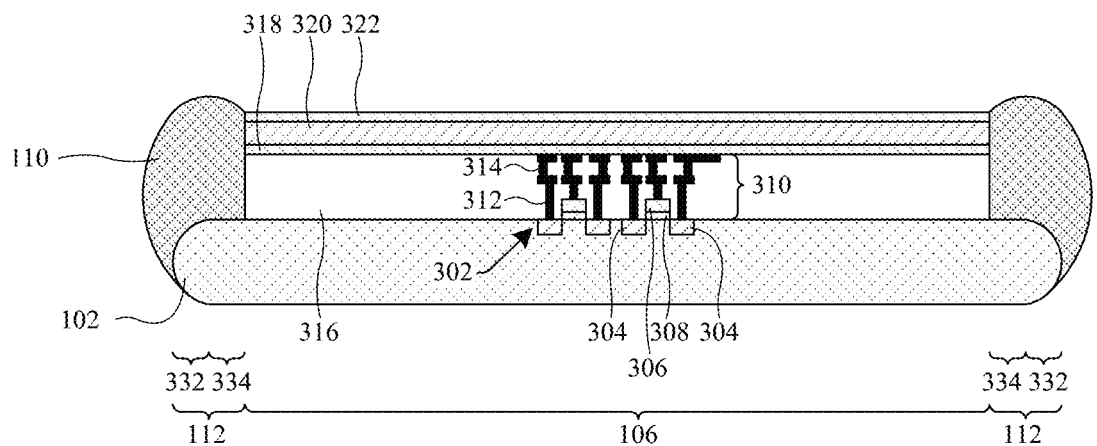

As shown in FIG. 12C, a second etch stop layer 322 is formed on the bonding structure dielectric layer 320. In some embodiments, a process for forming the second etch stop layer 322 may be a substantially similar process as described above in reference to FIG. 9C.

Also shown in FIG. 12C, bonding support structures 110 are formed over peripheral regions 112 of a semiconductor wafer 102, respectively. In some embodiments, a process for forming the bonding support structures 110 may be a substantially similar process as described above in reference to FIG. 11D.

Figure 12D:
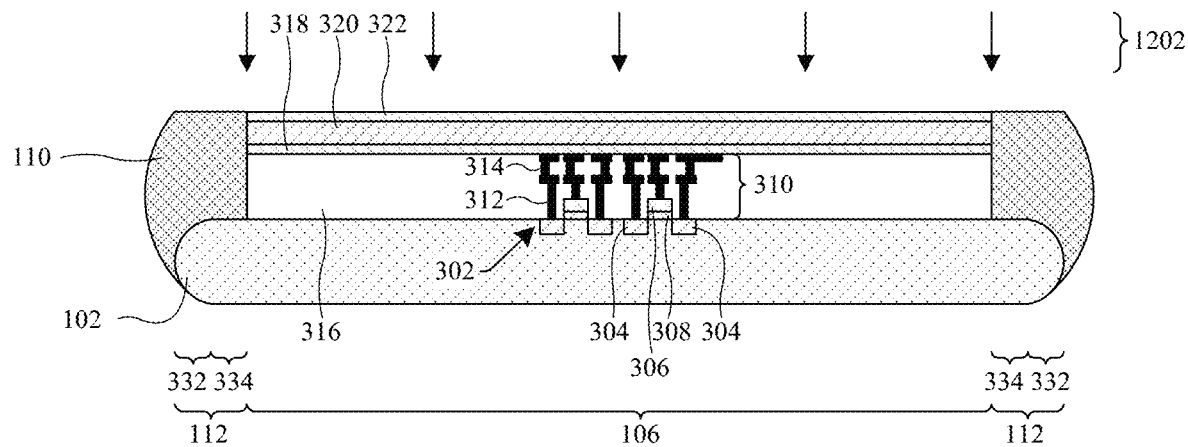

As shown in FIG. 12D, a third planarization process 1202 is performed on the bonding support structures 110 to planarize upper surfaces of the bonding support structures 110. In some embodiments, the third planarization process 1202 co-planarizes the upper surfaces of the bonding support structures 110 with an upper surface of the second etch stop layer 322. In further embodiments, the third planarization process 1202 may be a CMP process.

Figure 12E:
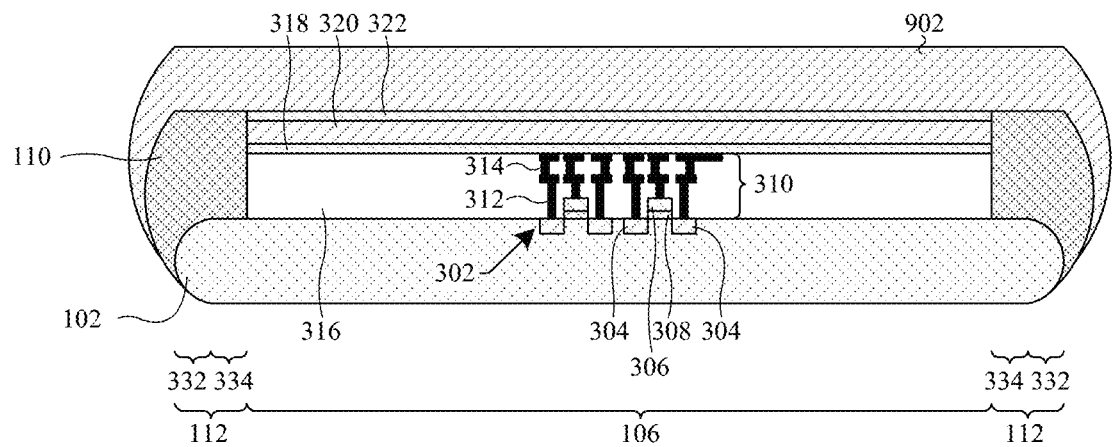

As shown in FIG. 12E, a first dielectric layer 902 is formed on the second etch stop layer 322 and on the bonding support structures 110. In some embodiments, a process for forming the first dielectric layer 902 may be a substantially similar process as described above in reference to FIG. 11E.

Figure 12F:
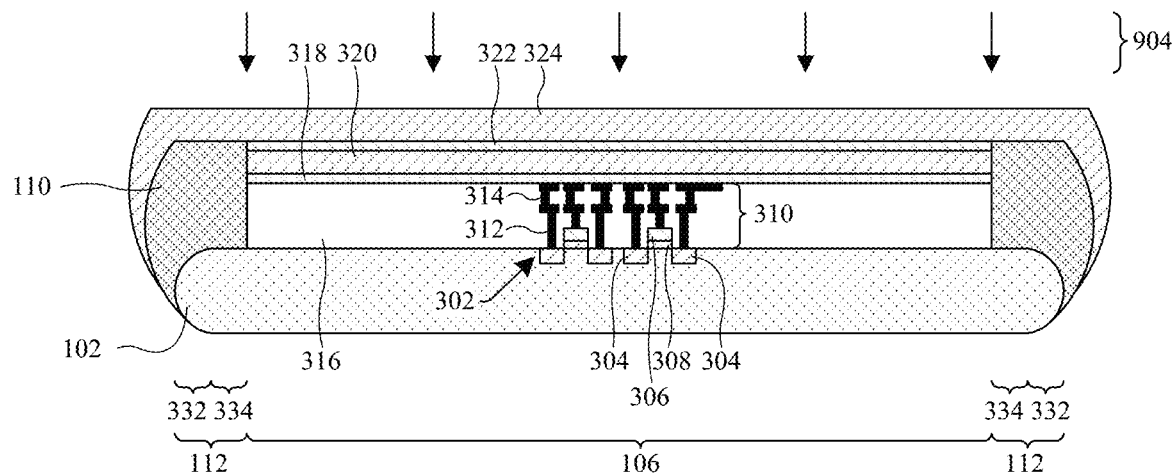

As shown in FIG. 12F, a first planarization process 904 process is performed on the first dielectric layer 902 (see, e.g., FIG. 12E) to form a redistribution dielectric layer 324 having a substantially planar upper surface. In some embodiments, the first planarization process 904 may be a substantially similar process as described above in reference to FIG. 9E.

Figure 12G:
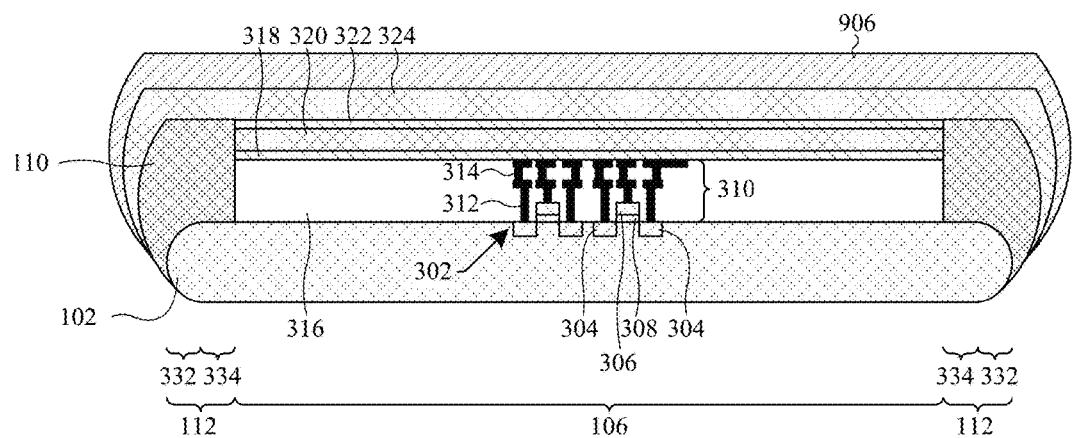

As shown in FIG. 12G, a second dielectric layer 906 is formed on the redistribution dielectric layer 324. In some embodiments, a process for forming the second dielectric layer 906 may be a substantially similar process as described above in reference to FIG. 11G.

Figure 12H:
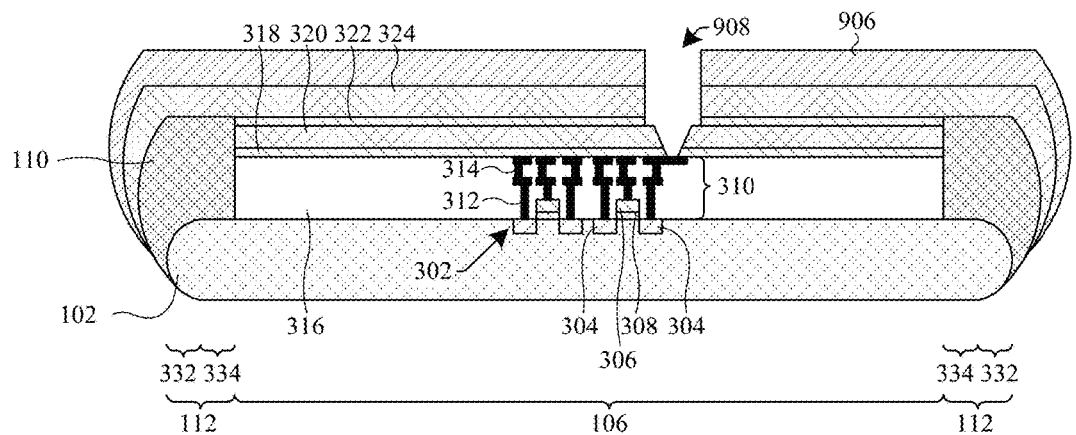

As shown in FIG. 12H, an opening 908 that extends from an upper surface of the second dielectric layer 906 to an uppermost conductive feature 314 is formed over the semiconductor wafer 102. In some embodiments, a process for forming the opening 908 may be a substantially similar process as described above in reference to FIG. 9G.

Figure 12I:
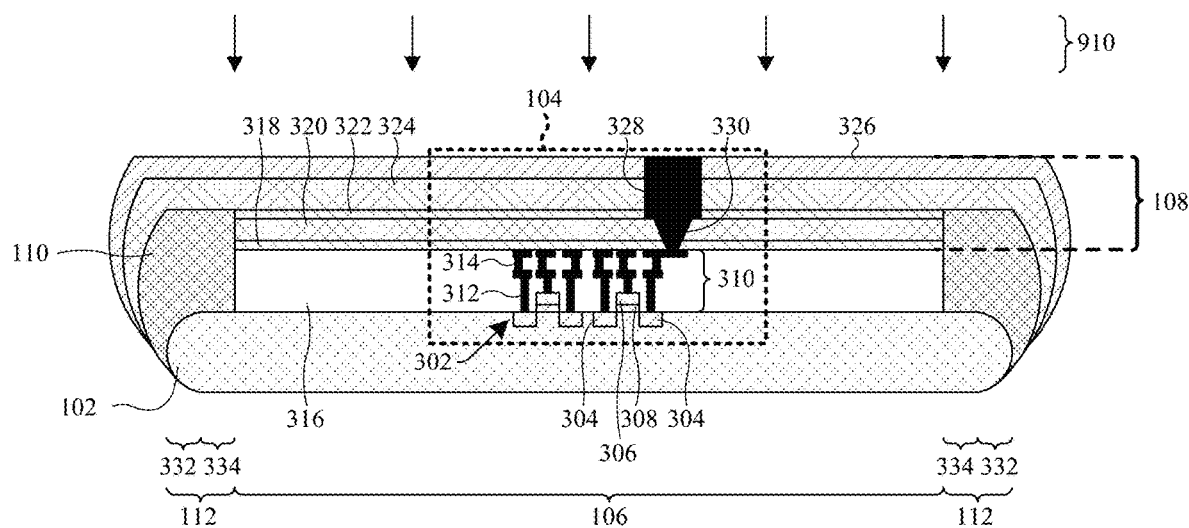

As shown in FIG. 12I, a conductive bonding via 330 and a conductive bonding link 328 are formed in the opening 908 (see, e.g., FIG. 12H). Further, a second planarization process 910 is performed on the second dielectric layer 906 (see, e.g., FIG. 12H) to form a bonding interface dielectric layer 326. In some embodiments, a process for forming the conductive bonding via 330, the conductive bonding link 328, and the bonding interface dielectric layer 326 may be a substantially similar process as described above in reference to FIG. 9H.

FIGS. 13A-13I illustrate a series of cross-sectional views of some embodiments of a method for forming the semiconductor wafer of FIG. 6.

Figure 13A:
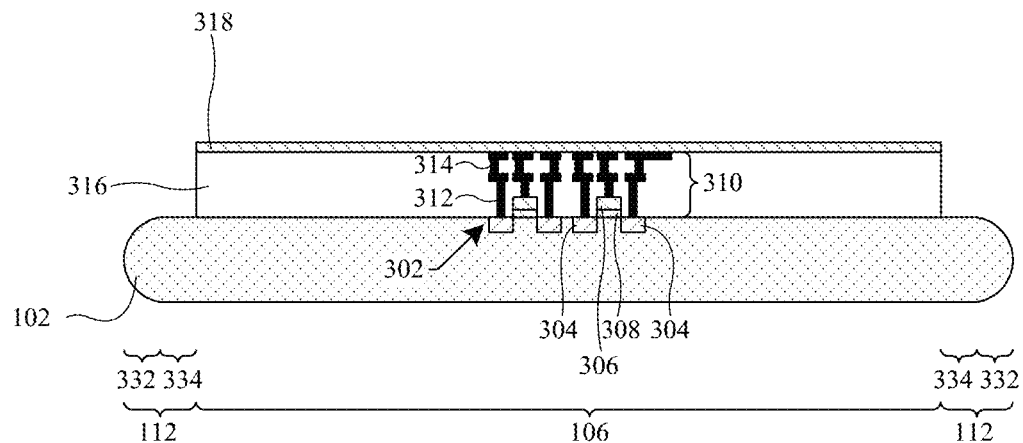
FIGS. 13A-13I illustrate a series of cross-sectional views of some embodiments of a method for forming the semiconductor wafer of FIG. 6.

As shown in FIG. 13A, a first etch stop layer 318 is formed on a plurality of stacked ILD layers 316 and on uppermost conductive features 314. In some embodiments, a process for forming the first etch stop layer 318 may be a substantially similar process as described above in reference to FIG. 9A.

Figure 13B:
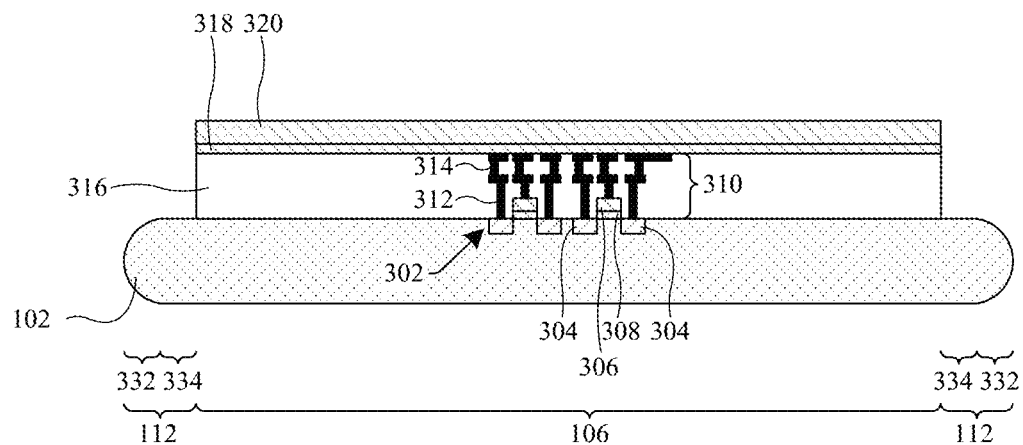

As shown in FIG. 13B, a bonding structure dielectric layer 320 is formed on the first etch stop layer 318. In some embodiments, a process for forming the bonding structure dielectric layer 320 may be a substantially similar process as described above in reference to FIG. 9B.

Figure 13C:
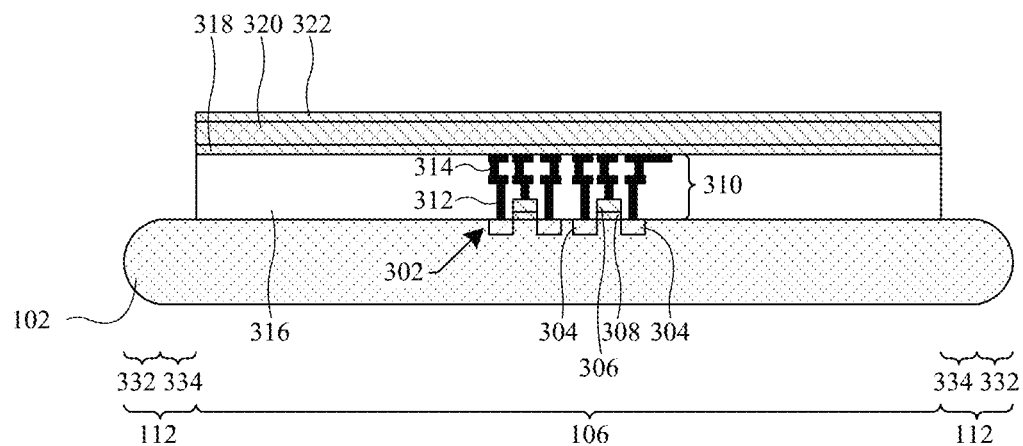

As shown in FIG. 13C, a second etch stop layer 322 is formed on the bonding structure dielectric layer 320. In some embodiments, a process for forming the second etch stop layer 322 may be a substantially similar process as described above in reference to FIG. 9C.

Figure 13D:
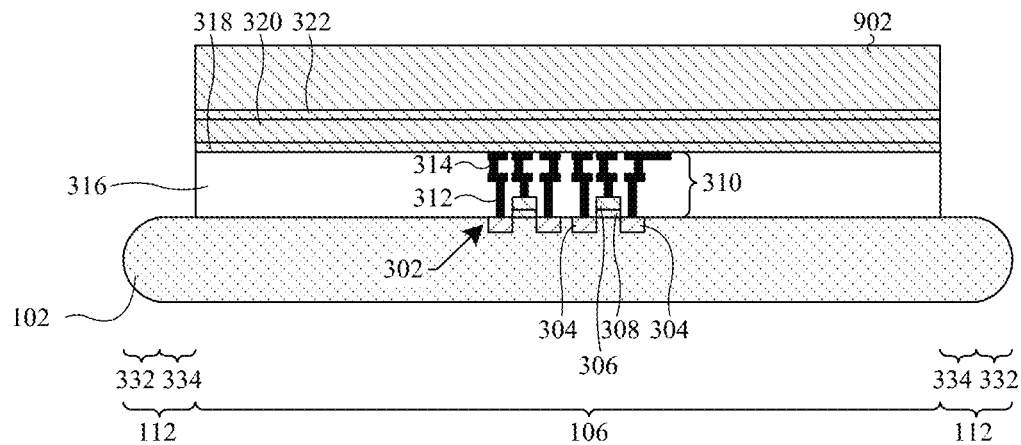

As shown in FIG. 13D, a first dielectric layer 902 is formed on the second etch stop layer 322. In some embodiments, a process for forming the first dielectric layer 902 may be a substantially similar process as described above in reference to FIG. 9D.

Figure 13E:
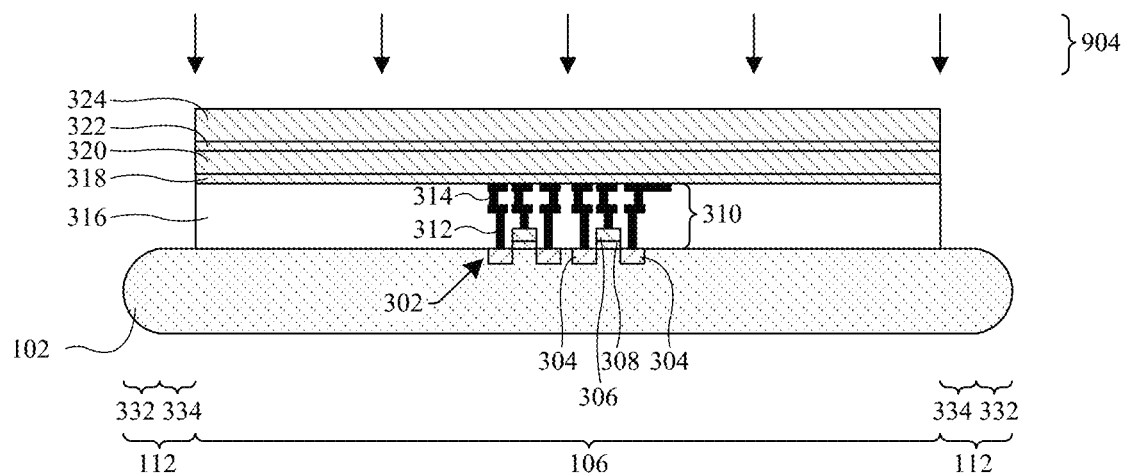

As shown in FIG. 13E, a first planarization process 904 process is performed on the first dielectric layer 902 (see, e.g., FIG. 13D) to form a redistribution dielectric layer 324 having a substantially planar upper surface. In some embodiments, the first planarization process 904 may be a substantially similar process as described above in reference to FIG. 9E.

Figure 13F:
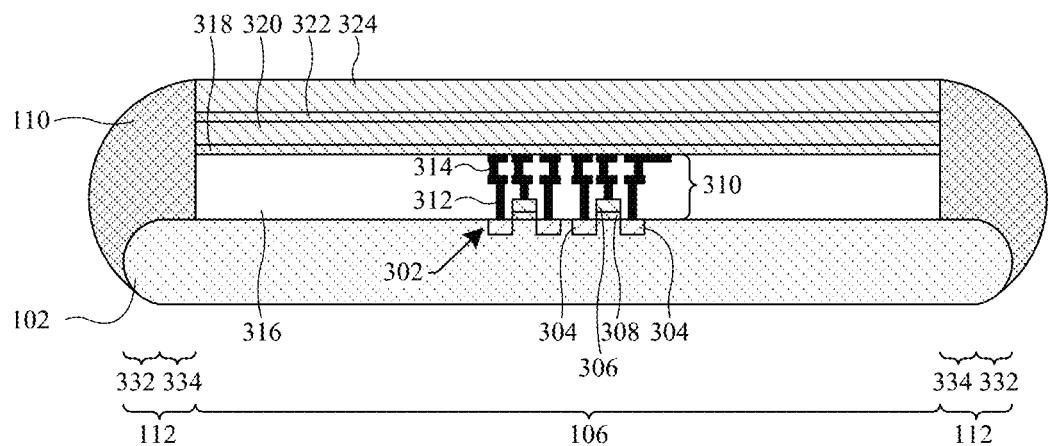

As shown in FIG. 13F, bonding support structures 110 are formed over peripheral regions 112 of a semiconductor wafer 102, respectively. In some embodiments, the bonding support structures 110 may be formed with outer sidewalls that extends from the upper surface of the redistribution dielectric layer 324 along a radius of curvature to below the mid-line axis (see, e.g., FIG. 4) of the semiconductor wafer 102, respectively. In further embodiments, a process for forming the bonding support structures 110 may be a substantially similar process as described above in reference to FIG. 11D.

Figure 13G:
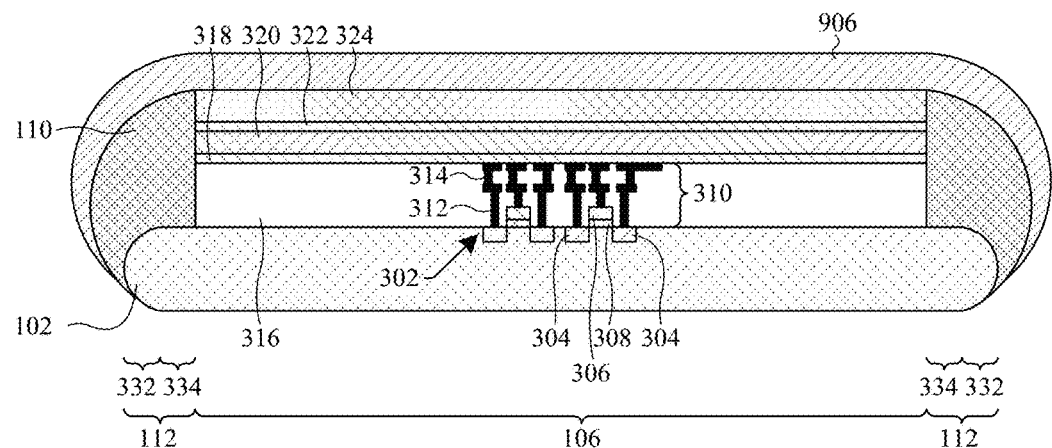

As shown in FIG. 13G, a second dielectric layer 906 is formed on the redistribution dielectric layer 324 and on the bonding support structures 110. In some embodiments, the second dielectric layer 906 may be formed conformally lining the redistribution dielectric layer 324 and the bonding support structures 110. In further embodiments, a process for forming the second dielectric layer 906 may be a substantially similar process as described above in reference to FIG. 11G.

Figure 13H:
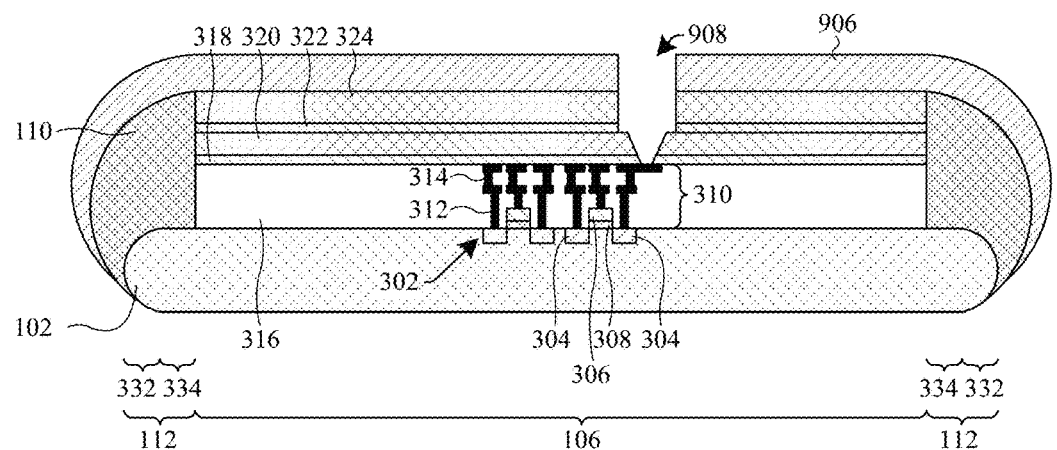

As shown in FIG. 13H, an opening 908 that extends from an upper surface of the second dielectric layer 906 to an uppermost conductive feature 314 is formed over the semiconductor wafer 102. In some embodiments, a process for forming the opening 908 may be a substantially similar process as described above in reference to FIG. 9G.

Figure 13I:
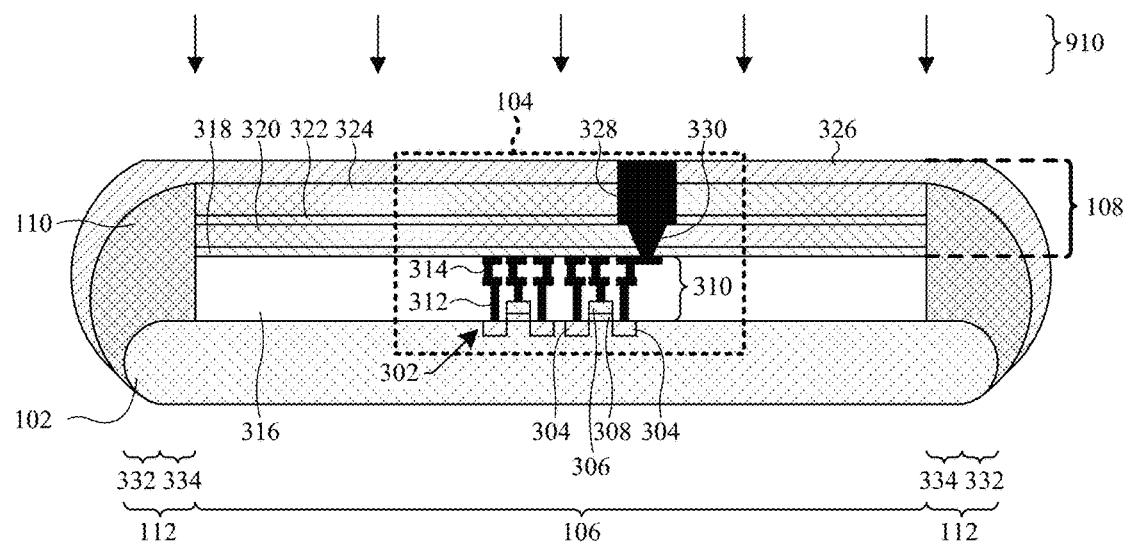

As shown in FIG. 13I, a conductive bonding via 330 and a conductive bonding link 328 are formed in the opening 908 (see, e.g., FIG. 13H). Further, a second planarization process 910 is performed on the second dielectric layer 906 (see, e.g., FIG. 13H) to form a bonding interface dielectric layer 326. In some embodiments, a process for forming the conductive bonding via 330, the conductive bonding link 328, and the bonding interface dielectric layer 326 may be a substantially similar process as described above in reference to FIG. 9H.

FIGS. 14A-14I illustrate a series of cross-sectional views of some embodiments of a method for forming the semiconductor wafer of FIG. 7.

Figure 14A:
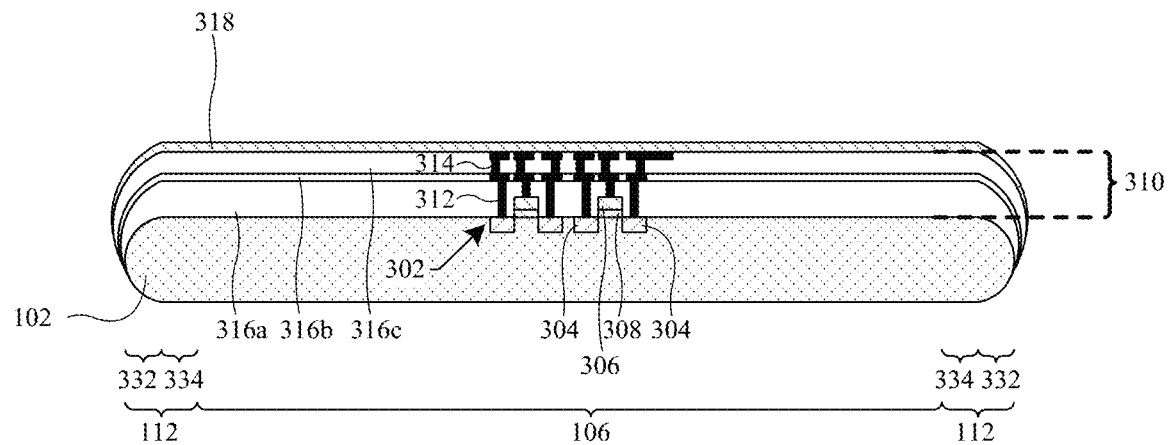
FIGS. 14A-14J illustrate a series of cross-sectional views of some embodiments of a method for forming the semiconductor wafer of FIG. 7.

As shown in FIG. 14A, a first etch stop layer 318 is formed on a third ILD layer 316c and on uppermost conductive features 314. In some embodiments, the first etch stop layer 318 is formed conformally lining the third ILD layer 316c, such that the first etch stop layer 318 is formed over both a central region 106 and peripheral regions 112 of the semiconductor wafer 102. In further embodiments, a process for forming the first etch stop layer 318 may be a substantially similar process as described above in reference to FIG. 9A.

Figure 14B:
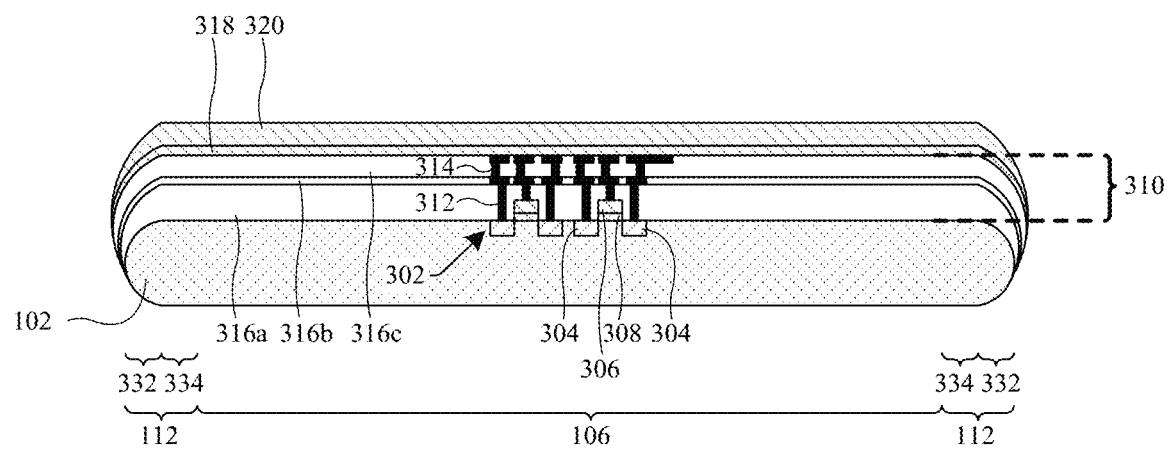

As shown in FIG. 14B, a bonding structure dielectric layer 320 is formed on the first etch stop layer 318. In some embodiments, the bonding structure dielectric layer 320 is formed conformally lining the first etch stop layer 318, such that the bonding structure dielectric layer 320 is formed over both the central region 106 and the peripheral regions 112 of the semiconductor wafer 102. In further embodiments, a process for forming the bonding structure dielectric layer 320 may be a substantially similar process as described above in reference to FIG. 9B.

Figure 14C:
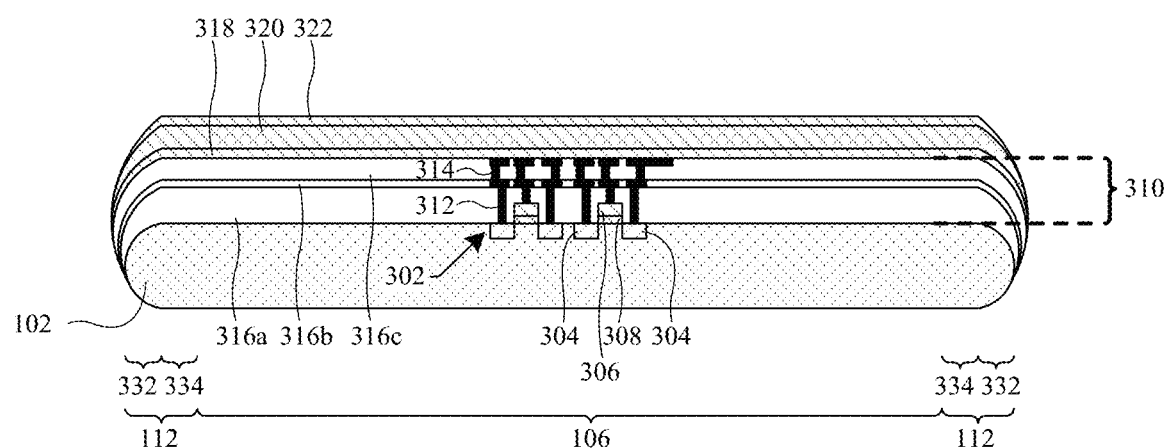

As shown in FIG. 14C, a second etch stop layer 322 is formed on the bonding structure dielectric layer 320. In some embodiments, the second etch stop layer 322 may be formed conformally lining the bonding structure dielectric layer 320, such that the second etch stop layer 322 is formed over both the central region 106 and the peripheral regions 112 of the semiconductor wafer 102. In further embodiments, a process for forming the second etch stop layer 322 may be a substantially similar process as described above in reference to FIG. 9C.

Figure 14D:
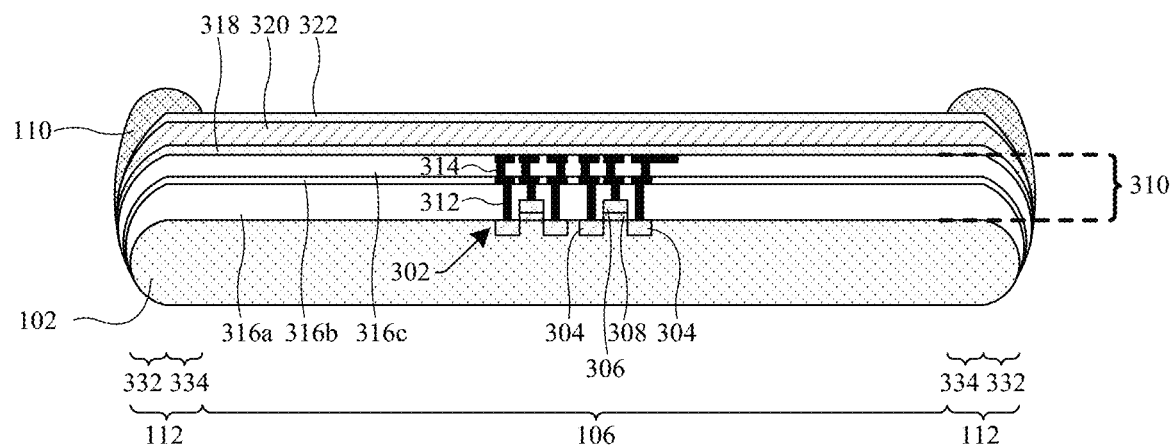

As shown in FIG. 14D, bonding support structures 110 are formed over the peripheral regions 112 of the semiconductor wafer 102. In some embodiments, the bonding support structures 110 are formed on the second etch stop layer 322. In further embodiments, the bonding support structures 110 are formed partially on opposite outer sidewalls of the second etch stop layer 322 and partially on an upper surface of the second etch stop layer 322. In such embodiments, the bonding support structures 110 may be formed with uppermost surfaces that are disposed over the upper surface of the second etch stop layer 322.

In some embodiments, the bonding support structures 110 may extend along the outer sidewalls of the second etch stop layer 322, such that the bonding support structures 110 are also partially disposed on the bonding structure dielectric layer 320, the first etch stop layer 318, the third ILD layer 316c, a second ILD layer 316b, a first ILD layer 316a, and/or the semiconductor wafer 102. In further embodiments, a process for forming the bonding support structures 110 may be a substantially similar process as described above in reference to FIG. 11D. While FIG. 14D illustrates the bonding support structures 110 being formed partially on opposite sidewalls and partially on the upper surface of the second etch stop layer 322, it will be appreciated that the bonding support structures 110 may be formed partially on opposite sidewalls and partially on an upper surface of the third ILD layer 316c, the first etch stop layer 318, the bonding structure dielectric layer 320, a first dielectric layer 902 (see, e.g., FIG. 13D), a redistribution dielectric layer 324 (see, e.g., FIG. 13E), a second dielectric layer 906 (see, e.g., FIG. 13G), a bonding interface dielectric layer 326 (see, e.g., FIG. 13I), or a combination of the foregoing.

Figure 14E:
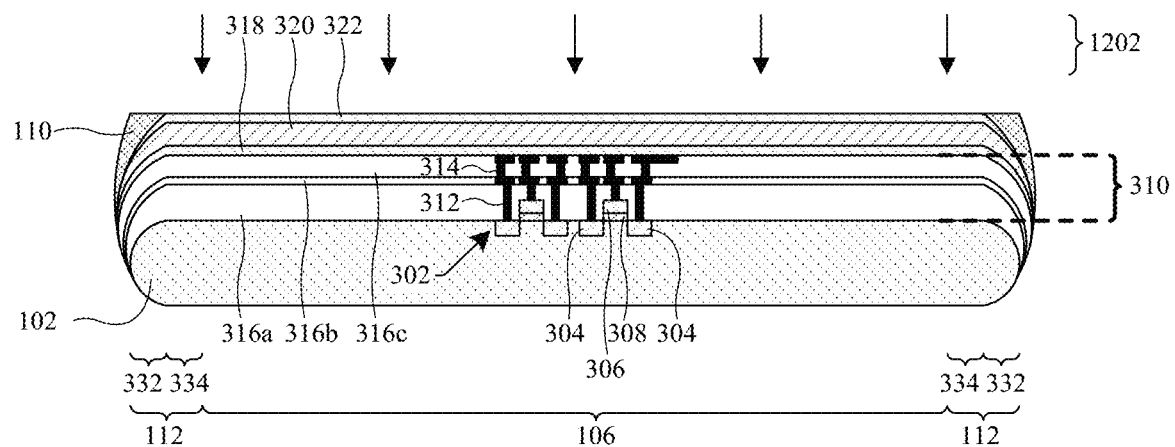

As shown in FIG. 14E, a third planarization process 1202 is performed on the bonding support structures 110 to planarize upper surfaces of the bonding support structures 110. In some embodiments, the third planarization process 1202 may be a substantially similar process as described above in reference to FIG. 12D.

Figure 14F:
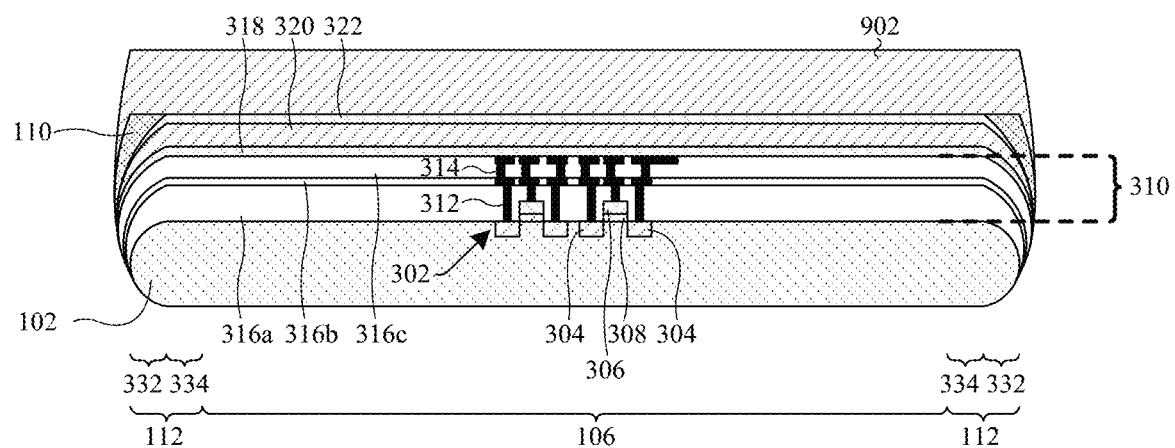

As shown in FIG. 14F, a first dielectric layer 902 is formed on the second etch stop layer 322 and on the bonding support structures 110. In some embodiments, the first dielectric layer 902 may be formed conformally lining the second etch stop layer 322 and the bonding support structures 110. In further embodiments, a process for forming the first dielectric layer 902 may be a substantially similar process as described above in reference to FIG. 11E.

Figure 14G:
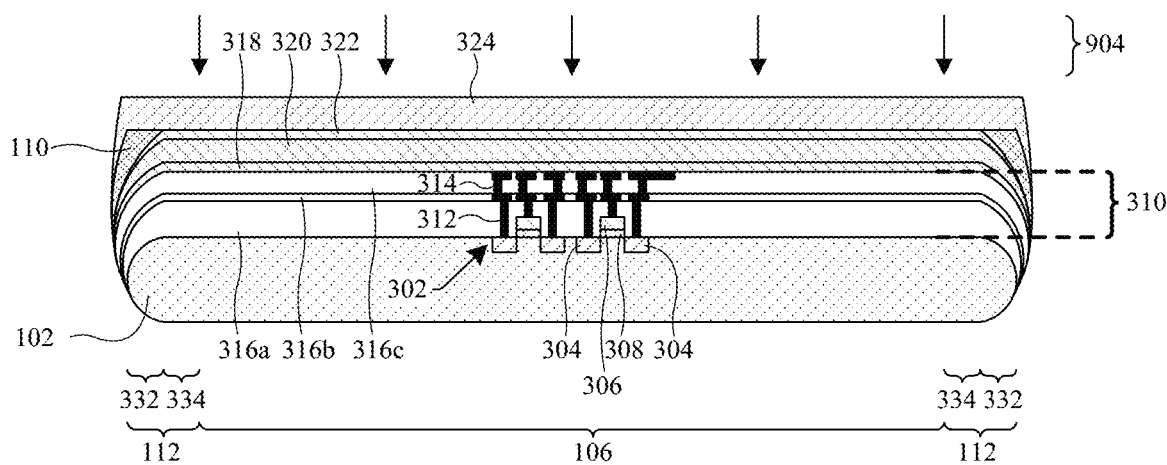

As shown in FIG. 14G, a first planarization process 904 process is performed on the first dielectric layer 902 (see, e.g., FIG. 14F) to form a redistribution dielectric layer 324 having a substantially planar upper surface. In some embodiments, the first planarization process 904 may be a substantially similar process as described above in reference to FIG. 9E.

Figure 14H:
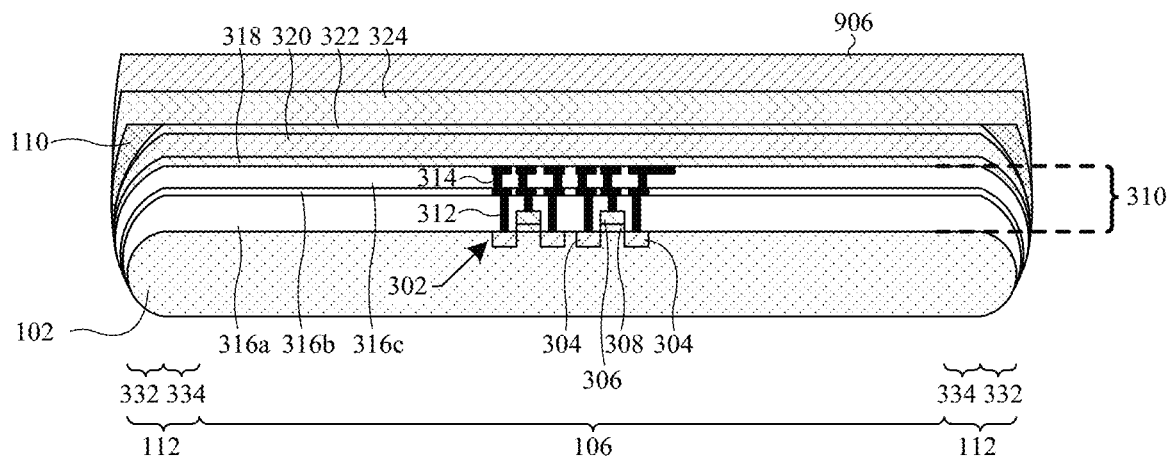

As shown in FIG. 14H, a second dielectric layer 906 is formed on the redistribution dielectric layer 324. In some embodiments, a process for forming the second dielectric layer 906 may be a substantially similar process as described above in reference to FIG. 11G.

Figure 14I:
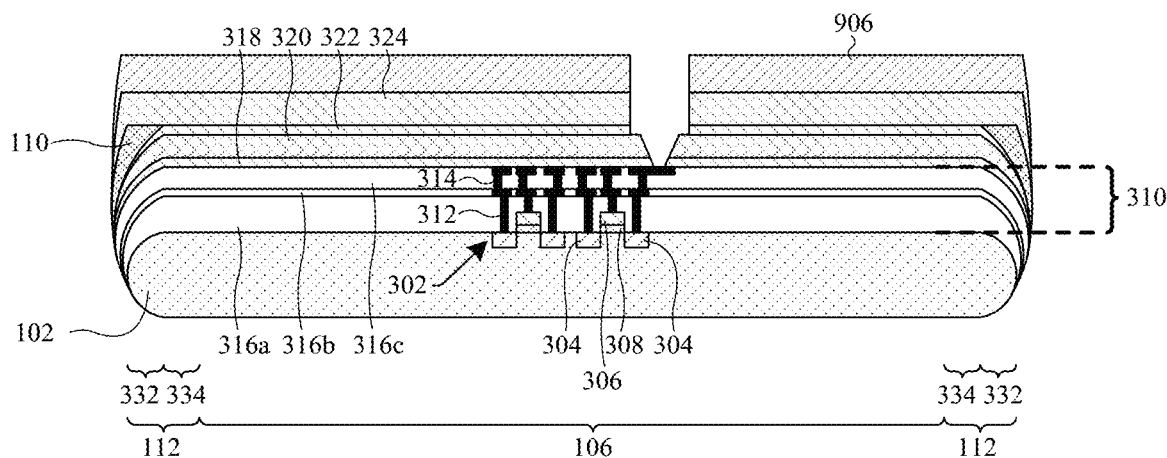

As shown in FIG. 14I, an opening 908 that extends from an upper surface of the second dielectric layer 906 to an uppermost conductive feature 314 is formed over the semiconductor wafer 102. In some embodiments, a process for forming the opening 908 may be a substantially similar process as described above in reference to FIG. 9G.

Figure 14J:
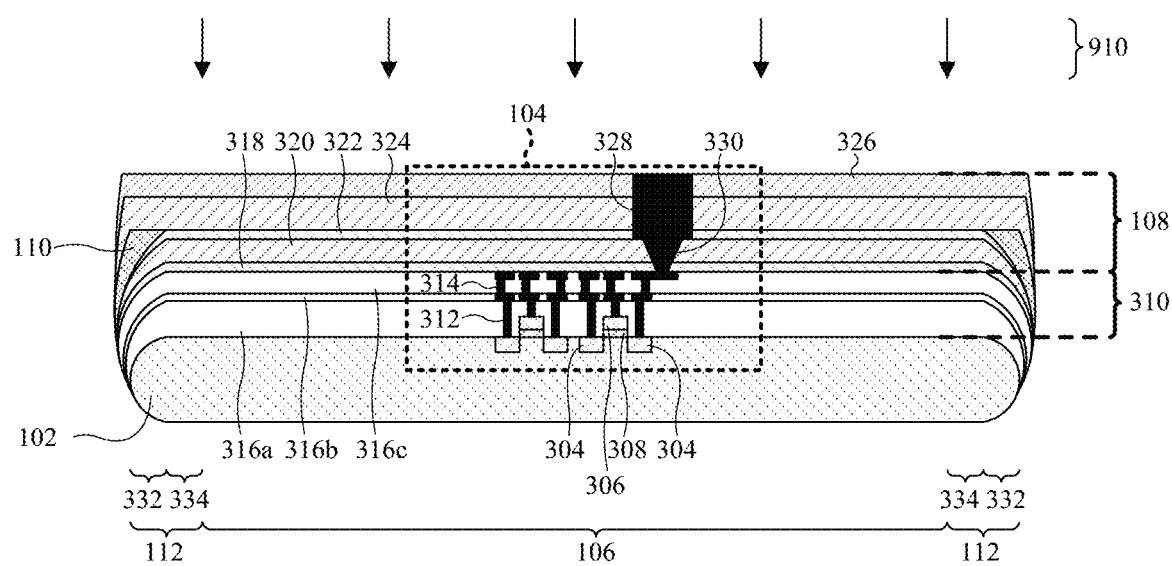

As shown in FIG. 14J, a conductive bonding via 330 and a conductive bonding link 328 are formed in the opening 908 (see, e.g., FIG. 13H). Further, a second planarization process 910 is performed on the second dielectric layer 906 (see, e.g., FIG. 13H) to form a bonding interface dielectric layer 326. In some embodiments, a process for forming the conductive bonding via 330, the conductive bonding link 328, and the bonding interface dielectric layer 326 may be a substantially similar process as described above in reference to FIG. 9H.

Figure 15:
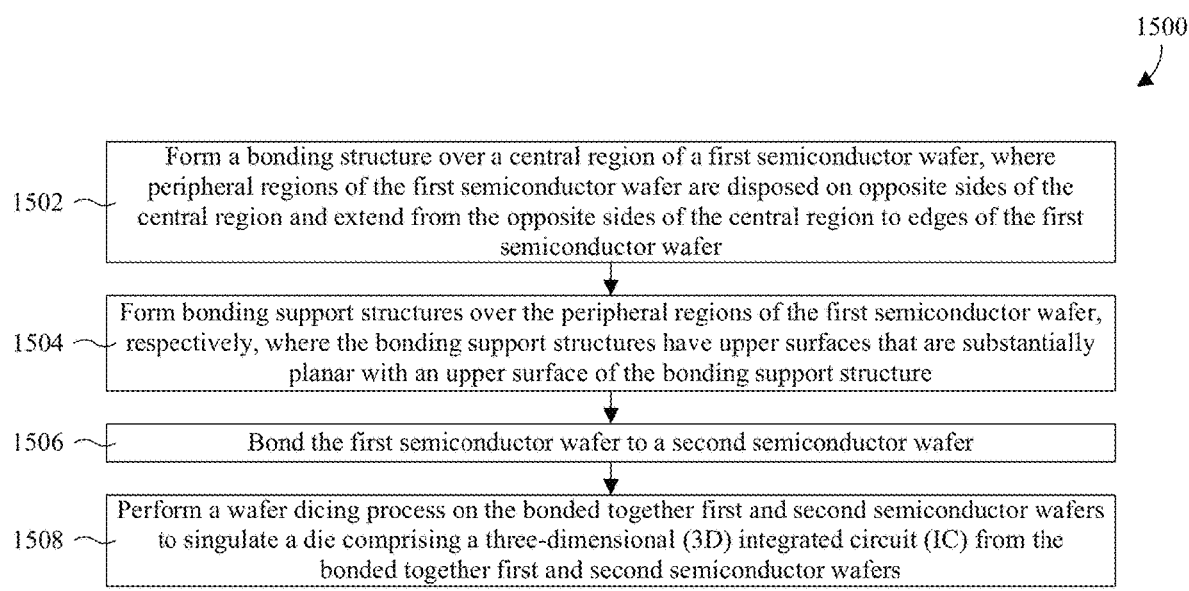
FIG. 15 illustrates a flowchart of some embodiments of a method for forming the semiconductor wafer of FIG. 3 and bonding the semiconductor wafer of FIG. 3 to another semiconductor wafer.

As illustrated in FIG. 15, a flowchart 1500 of some embodiments of a method for forming the semiconductor wafer of FIG. 3 and bonding the semiconductor wafer of FIG. 3 to another semiconductor wafer is provided. While the flowchart 1500 of FIG. 15 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1502, a bonding structure is formed over a central region of a first semiconductor wafer, where peripheral regions of the first semiconductor wafer are disposed on opposite sides of the central region and extend from the opposite sides of the central region to edges of the first semiconductor wafer. FIGS. 9A-9H illustrate a series of cross-sectional views of some embodiments corresponding to act 1502.

At act 1504, bonding support structures are formed over the peripheral regions of the first semiconductor wafer, respectively, where the bonding support structures have upper surfaces that are substantially planar with an upper surface of the bonding support structure. FIG. 9I illustrates a cross-sectional view of some embodiments corresponding to act 1504.

At act 1506, the first semiconductor wafer is bonded to a second semiconductor wafer. FIG. 9J illustrates a cross-sectional view of some embodiments corresponding to act 1506.

By forming the bonding support structures over the peripheral regions of the first semiconductor wafer, non-bond (NB) areas over the peripheral regions of the first semiconductor wafer may be reduced. In some embodiments, the bonding support structures may reduce NB areas over the peripheral regions of the first semiconductor wafer due to the upper surfaces of the bonding support structures being substantially planar with the upper surface of the bonding structure. In other embodiments, the bonding support structures may reduce NB areas over the peripheral regions of the first semiconductor wafer by being a substructure over which the bonding structure (or portions of the bonding structure) may be formed, such that the bonding structure may be formed with a substantially planar upper surface that extends between opposite edges of the first semiconductor wafer.

By reducing NB areas over the peripheral regions of the first semiconductor wafer, during bonding, structural support between the first semiconductor wafer and the second semiconductor wafer may be improved. The improved structural support may reduce unwanted mechanical stresses during bonding and/or during subsequent processing steps of the bonded together first and second semiconductor wafers.

At 1508, a wafer dicing process is performed on the bonded together first and second semiconductor wafers to singulate a die comprising a three-dimensional (3D) integrated circuit (IC) from the bonded together first and second semiconductor wafers. FIG. 9K illustrates a cross-sectional view of some embodiments corresponding to act 1508.

In some embodiments, the present application provides a method for bonding semiconductor wafers. The method includes forming a first integrated circuit (IC) over a central region of a first semiconductor wafer. A first ring-shaped bonding support structure is formed over a ring-shaped peripheral region of the first semiconductor wafer, where the ring-shaped peripheral region of the first semiconductor wafer encircles the central region of the first semiconductor wafer. A second semiconductor wafer is bonded to the first semiconductor wafer, such that a second IC arranged on the second semiconductor wafer is electrically coupled to the first IC. In some embodiments, forming the first IC includes forming an etch stop layer over an interconnect structure, wherein the interconnect structure is disposed over the first semiconductor wafer, and forming a dielectric layer over the interconnect structure and over the first ring-shaped bonding support structure, wherein the first ring-shaped bonding support structure is formed after the etch stop layer. In some embodiments, forming the first IC further includes performing a first planarization process on the dielectric layer to form a redistribution dielectric layer. In some embodiments, the redistribution dielectric layer contacts both the etch stop layer and the first ring-shaped bonding support structure. In some embodiments, forming the first IC includes forming a bonding interface dielectric layer over the redistribution dielectric layer, wherein the bonding interface dielectric layer has a substantially planar upper surface that extends between opposite edges of the first semiconductor wafer. In some embodiments, forming the first IC further includes, before the dielectric layer is formed, performing a second planarization process on the first ring-shaped bonding support structure, such that an upper surface of the first ring-shaped bonding support structure is substantially planar with an upper surface of the etch stop layer. In some embodiments, forming the first IC includes forming a redistribution dielectric layer over an interconnect structure, wherein the interconnect structure is disposed over the first semiconductor wafer, and forming a bonding interface dielectric layer on both the redistribution dielectric layer and the first ring-shaped bonding support structure, wherein the first ring-shaped bonding support structure is formed after the redistribution dielectric layer. In some embodiments, the ring-shaped bonding support structure has a rounded outer sidewall that extends from about an upper surface of the redistribution dielectric layer to the first semiconductor wafer. In some embodiments, forming the first IC includes forming a bonding structure over an interconnect structure, wherein the interconnect structure is disposed over the first semiconductor wafer, wherein the bonding structure includes a conductive bonding link disposed in a bonding interface dielectric layer, and wherein the first ring-shaped bonding support structure is formed after the bonding structure. In some embodiments, an upper surface of the ring-shaped bonding support structure is substantially planar with both an upper surface of the conductive bonding link and an upper surface of the bonding interface dielectric layer. In some embodiments, a diameter of the central region of the first semiconductor wafer is between about 92 percent of a diameter of the first semiconductor wafer and about 99.8 percent of the diameter of the first semiconductor wafer. In some embodiments, the ring-shaped bonding support structure has a ring thickness that is between about 0.1 percent of the diameter of the first semiconductor wafer and about 4 percent of the diameter of the first semiconductor wafer. In some embodiments, the method further includes forming a second ring-shaped bonding support structure over a ring-shaped peripheral region of the second semiconductor wafer, wherein the ring-shaped peripheral region of the second semiconductor wafer encircles a central region of the second semiconductor wafer, wherein the second IC is disposed over the central region of the second semiconductor wafer, and wherein bonding the first semiconductor wafer to the second semiconductor wafer forms a dielectric-to-dielectric bond between the first ring-shaped bonding support structure and the second ring-shaped bonding support structure.

In other embodiments, the present application provides a method for bonding semiconductor wafers. The method includes forming a plurality of stacked interlayer dielectric (ILD) layers on a first side of a first semiconductor wafer. The plurality of stacked ILD layers have a first thickness over a central region of the first semiconductor wafer and a second thickness over peripheral regions of the first semiconductor wafer, the second thickness less than the first thickness. A ring-shaped bonding support structure having a layer of dielectric material is formed over the peripheral regions after formation of one or more of the plurality of stacked ILD layers, where the layer of dielectric material has a sidewall facing a side of one or more of the plurality of stacked ILD layers. A second semiconductor wafer is bonded to the first side of the first semiconductor wafer. In some embodiments, an outermost surface of the ring-shaped bonding support structure is spaced from the central region of the first semiconductor wafer by a greater distance than an edge of the first semiconductor wafer is spaced from the central region. In some embodiments, the ring-shaped bonding support structure extends from the first side of the first semiconductor wafer to beyond a mid-line axis of the first semiconductor wafer, wherein the mid-line axis extends laterally through the first semiconductor wafer and is evenly spaced from the first side of the first semiconductor wafer and a second side of the first semiconductor wafer opposite the first side. In some embodiments, the bonding support structure is devoid of metal interconnect layers. In some embodiments, forming the ring-shaped bonding support structure includes performing a chemical vapor deposition (CVD) process to selectively form the ring-shaped bonding support structure over the peripheral regions of the first semiconductor wafer, wherein the ring-shaped bonding support structure includes an oxide, a nitride, or an oxynitride.

In yet other embodiments, the present application provides a plurality of bonded together semiconductor wafers. The plurality of bonded together semiconductor wafers includes a plurality of stacked interlayer dielectric (ILD) layers disposed over a central region of a first side of a first semiconductor wafer. A ring-shaped bonding support having a layer of dielectric material is arranged over a ring-shaped peripheral region of the first semiconductor wafer. The ring-shaped peripheral region of the first semiconductor wafer encircles the central region of the first semiconductor wafer, where the layer of dielectric material has a sidewall facing a side of one or more of the plurality of stacked ILD layers. A second semiconductor wafer bonded to the first side of the first semiconductor wafer. In some embodiments, an upper surface of the ring-shaped bonding support structure is spaced from the first side of the first semiconductor wafer by a greater distance than an uppermost surface of the plurality of stacked ILD layers is spaced from the first side of the first semiconductor wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for bonding semiconductor wafers, the method comprising:
   forming a plurality of first integrated circuits (ICs) over a first semiconductor wafer and within a perimeter of a central region of the first semiconductor wafer;
   forming a first ring-shaped bonding support structure over the first semiconductor wafer and within a ring-shaped peripheral region of the first semiconductor wafer, wherein the ring-shaped peripheral region of the first semiconductor wafer encircles the central region of the first semiconductor wafer; and
   bonding a second semiconductor wafer to the first semiconductor wafer, such that a plurality of second ICs disposed over the second semiconductor wafer are electrically coupled to the first ICs, respectively.

2. The method of claim 1, wherein forming the first ICs comprises:
   forming an etch stop layer over a plurality of interconnect structures, wherein the interconnect structures are disposed over the first semiconductor wafer, and wherein each of the interconnect structures correspond to one of the first ICs; and
   forming a dielectric layer over the interconnect structures and over the first ring-shaped bonding support structure, wherein the first ring-shaped bonding support structure is formed after the etch stop layer.

3. The method of claim 2, wherein forming the first ICs further comprises:
performing a first planarization process on the dielectric layer to form a redistribution dielectric layer.

4. The method of claim 3, wherein the redistribution dielectric layer contacts both the etch stop layer and the first ring-shaped bonding support structure.

5. The method of claim 4, wherein forming the first ICs further comprises:
forming a bonding interface dielectric layer over the redistribution dielectric layer, wherein the bonding interface dielectric layer has a substantially planar upper surface that extends between opposite outermost edges of the first semiconductor wafer.

6. The method of claim 5, wherein forming the first ICs further comprises:
before the dielectric layer is formed, performing a second planarization process on the first ring-shaped bonding support structure, such that an upper surface of the first ring-shaped bonding support structure is substantially planar with an upper surface of the etch stop layer.

7. The method of claim 1, wherein forming the first ICs comprises:
forming a redistribution dielectric layer over a plurality of interconnect structures, wherein the interconnect structures are disposed over the first semiconductor wafer, and wherein each of the interconnect structures correspond to one of the first ICs; and
forming a bonding interface dielectric layer on both the redistribution dielectric layer and the first ring-shaped bonding support structure, wherein the first ring-shaped bonding support structure is formed after the redistribution dielectric layer.

8. The method of claim 7, wherein the first ring-shaped bonding support structure has a rounded outer sidewall that extends from about an upper surface of the redistribution dielectric layer to the first semiconductor wafer.

9. The method of claim 1, wherein forming the first ICs comprises:
forming a bonding structure over a plurality of interconnect structures, wherein the interconnect structures are disposed over the first semiconductor wafer, wherein each of the interconnect structures correspond to one of the first ICs, wherein the bonding structure comprises a conductive bonding link disposed in a bonding interface dielectric layer, and wherein the first ring-shaped bonding support structure is formed after the bonding structure.

10. The method of claim 9, wherein an upper surface of the first ring-shaped bonding support structure is substantially planar with both an upper surface of the conductive bonding link and an upper surface of the bonding interface dielectric layer.

11. The method of claim 1, wherein a diameter of the central region of the first semiconductor wafer is between about 92 percent of a diameter of the first semiconductor wafer and about 99.8 percent of the diameter of the first semiconductor wafer.

12. The method of claim 11, wherein the first ring-shaped bonding support structure has a ring thickness that is between about 0.1 percent of the diameter of the first semiconductor wafer and about 4 percent of the diameter of the first semiconductor wafer.

13. The method of claim 1, further comprising:
forming a second ring-shaped bonding support structure over the second semiconductor wafer and within a ring-shaped peripheral region of the second semiconductor wafer;
wherein the ring-shaped peripheral region of the second semiconductor wafer encircles a central region of the second semiconductor wafer;
wherein the second ICs are disposed over the second semiconductor wafer and within a perimeter of the central region of the second semiconductor wafer; and
wherein bonding the first semiconductor wafer to the second semiconductor wafer forms a dielectric-to-dielectric bond between the first ring-shaped bonding support structure and the second ring-shaped bonding support structure.

14. A method for bonding semiconductor wafers, the method comprising:
forming a plurality of stacked interlayer dielectric (ILD) layers on a first side of a first semiconductor wafer, wherein the plurality of stacked ILD layers have a first thickness over a central region of the first semiconductor wafer and a second thickness over a ring-shaped peripheral region of the first semiconductor wafer, wherein the second thickness is less than the first thickness, wherein the ring-shaped peripheral region encircles the central region and extends from the central region to an outermost edge of the first semiconductor wafer, and wherein, in the ring-shaped peripheral region, a thickness of the first semiconductor wafer continuously decreases from the central region to the outermost edge;
forming a ring-shaped bonding support structure comprising a layer of dielectric material within the ring-shaped peripheral region after formation of one or more of the plurality of stacked ILD layers, wherein the layer of dielectric material has a sidewall facing a side of one or more of the plurality of stacked ILD layers; and
bonding a second semiconductor wafer to the first side of the first semiconductor wafer.

15. The method of claim 14, wherein an outermost surface of the ring-shaped bonding support structure is spaced a greater distance from the central region than the outermost edge.

16. The method of claim 14, wherein the ring-shaped bonding support structure extends from the first side of the first semiconductor wafer to beyond a mid-line axis of the first semiconductor wafer, wherein the mid-line axis extends laterally through the first semiconductor wafer and is evenly spaced from the first side of the first semiconductor wafer and a second side of the first semiconductor wafer opposite the first side.

17. The method of claim 14, wherein the ring-shaped bonding support structure is devoid of metal interconnect layers.

18. The method of claim 14, wherein forming the ring-shaped bonding support structure comprises:
performing a chemical vapor deposition (CVD) process to selectively form the ring-shaped bonding support structure over the ring-shaped peripheral region, wherein the ring-shaped bonding support structure comprises an oxide, a nitride, or an oxynitride.

19. A plurality of bonded together semiconductor wafers, comprising:
a plurality of stacked interlayer dielectric (ILD) layers disposed over a first side of a first semiconductor wafer and over a central region of the first semiconductor wafer, wherein an outermost edge of the first semiconductor wafer arcs continuously along a closed path;

a ring-shaped bonding support structure comprising a layer of dielectric material disposed within a ring-shaped peripheral region of the first semiconductor wafer, wherein the ring-shaped peripheral region encircles the central region, wherein the ring-shaped peripheral region extends from the central region to the outermost edge, and wherein the layer of dielectric material has a sidewall facing a side of one or more of the plurality of stacked ILD layers; and a second semiconductor wafer bonded to the first side of the first semiconductor wafer.

20. The plurality of bonded together semiconductor wafers of claim 19, wherein an upper surface of the ring-shaped bonding support structure is spaced from the first side of the first semiconductor wafer by a greater distance than an uppermost surface of the plurality of stacked ILD layers is spaced from the first side of the first semiconductor wafer.

\* \* \* \* \*